(12) United States Patent
Gilroy et al.

(10) Patent No.: US 10,538,618 B2
(45) Date of Patent: Jan. 21, 2020

(54) POLYMER BASED MEMRISTORS

(71) Applicant: THE UNIVERSITY OF WESTERN ONTARIO, London, ON (CA)

(72) Inventors: Joe B. Gilroy, London (CA); Giovanni Fanchini, London (CA); Joseph A. Paquette, Blind River (CA); Sabastine C. Ezugwu, London (CA)

(73) Assignee: THE UNIVERSITY OF WESTERN ONTARIO, London, ON (CA)

( * ) Notice: Subject to any disclaimer, the term of this patent is extended or adjusted under 35 U.S.C. 154(b) by 66 days.

(21) Appl. No.: 15/869,607

(22) Filed: Jan. 12, 2018

(65) Prior Publication Data

US 2018/0201723 A1    Jul. 19, 2018

Related U.S. Application Data

(60) Provisional application No. 62/446,631, filed on Jan. 16, 2017.

(51) Int. Cl.
*C08G 61/02* (2006.01)
*G11C 13/00* (2006.01)
(Continued)

(52) U.S. Cl.
CPC .......... *C08G 61/02* (2013.01); *G11C 13/0016* (2013.01); *H01L 27/2463* (2013.01); *H01L 45/1233* (2013.01); *H01L 45/1253* (2013.01); *H01L 45/149* (2013.01); *C08G 2261/11* (2013.01); *C08G 2261/143* (2013.01);
(Continued)

(58) Field of Classification Search
CPC .............. C08G 61/02; C08G 2261/143; C08G 2261/1426; C08G 2261/149; C08G 2261/418; C08G 2261/592; H01L 45/1253; H01L 45/1233; H01L 45/149; H01L 27/2463; G11C 13/0016; G11C 13/004;
(Continued)

(56) References Cited

FOREIGN PATENT DOCUMENTS

JP     2007305481     * 11/2007  .............. H01M 4/60

OTHER PUBLICATIONS

Kamachi et al. (Polymer Journal, vol. 18, No. 5, pp. 439-441, 1986).*

(Continued)

*Primary Examiner* — Shane Fang
(74) *Attorney, Agent, or Firm* — Hill & Schumacher

(57) ABSTRACT

Disclosed herein are redox-active 6-oxoverdazyl polymers having structures (S1) and (S2) synthesized via ring-opening metathesis polymerization (ROMP) and their solution, bulk, and thin-film properties investigated. Detailed studies of the ROMP method employed confirmed that stable radical polymers with controlled molecular weights and narrow molecular weight distributions (Đ<1.2) were produced. Thermal gravimetric analysis of a representative example of the title polymers demonstrated stability up to 190° C., while differential scanning calorimetry studies revealed a glass transition temperature of 152° C. An ultrathin memristor device was produced using these polymers, namely a 10 nm homogeneous thin film of poly-[1,5-diisopropyl-3-(cis-5-norbornene-exo-2,3-dicarboxiimide)-6-oxoverdazyl] (P6OV), a poly-radical with three tunable charge states per each radical monomer: positive, neutral and negative.

20 Claims, 22 Drawing Sheets

(51) Int. Cl.
    H01L 45/00       (2006.01)
    H01L 27/24       (2006.01)
(52) U.S. Cl.
    CPC .......... C08G 2261/149 (2013.01); C08G
           2261/1426 (2013.01); C08G 2261/418
        (2013.01); C08G 2261/592 (2013.01); G11C
           13/004 (2013.01); G11C 13/0069 (2013.01);
              G11C 13/0097 (2013.01); G11C 2213/15
            (2013.01); G11C 2213/52 (2013.01); G11C
                                      2213/77 (2013.01)
(58) Field of Classification Search
    CPC ............ G11C 13/0069; G11C 13/0097; G11C
                   2213/77; G11C 2213/15; G11C 2213/52
    See application file for complete search history.

(56) References Cited

OTHER PUBLICATIONS

Miura et al. (Macromolekulare Chemie, 1972, 51-61).*
K. Oyaizu, H. Nishide, "Radical Polymers for Organic Electronic Devices: A Radical Departure from Conjugated Polymers?" Adv. Mater. 2009, 21, pp. 2339-2344.
E. P. Tomlinson, M. E. Hay, B. W. Boudouris, "Radical Polymers and Their Application to Organic Electronic Devices", Macromolecules 2014, 47, pp. 6145-6158.
T. K. Kunz, M. O. Wolf, "Electrodeposition and properties of TEMPO functionalized polythiophene thin films", Polym. Chem. 2011, 2, pp. 640-644.
L. Rostro, A. G. Baradwaj, B. W. Boudouris, "Controlled Radical Polymerization and Quantification of Solid State Electrical Conductivities of Macromolecules Bearing Pendant Stable Radical Groups", ACS Appl. Mater. Interfaces 2013, 5, pp. 9896-9901.
L. Rostra, S. H. Wong, B. W. Boudouris, "Solid State Electrical Conductivity of Radical Polymers as a Function of Pendant Group Oxidation State", Macromolecules 2014, 47, pp. 3713-3719.
Y. Yonekuta, K. Susuki, K. Oyaizu, K. Honda, H. Nishide, "Battery-Inspired, Nonvolatile, and Rewritable Memory Architecture: a Radical Polymer-Based Organic Device", J. Am. Chem. Soc. 2007, 129, pp. 14128-14129.
Y. Yonekuta, K. Honda, H. Nishide, "A non-volatile, bistable, and rewritable memory device fabricated with poly(nitroxide radical) and silver salt layers", Polym. Adv. Technol. 2008, 19, pp. 281-284.
T. Suga, K. Aoki, H. Nishide, "Ionic Liquid-Triggered Redox Molecule Placement in Block Copolymer Nanotemplates toward an Organic Resistive Memory", ACS Macro Lett. 2015, 4, p. 892-896.
M. Suguro, S. Iwasa, K. Nakahara, "Fabrication of a Practical and Polymer-Rich Organic Radical Polymer Electrode and its Rate Dependence", Macromol. Rapid Commun. 2008, 29, p. 1635-1639.
J. Qu, T. Katsumata, M. Satoh, J. Wada, T. Masuda, "Poly(7-oxanorbornenes) carrying 2,2,6,6 tetramethylpiperidine-1-oxy (TEMPO) radicals: Synthesis and charge/discharge properties", Polymer 2009, 50, pp. 391-396.
M.-K. Hung, Y.-H. Wang, C.-H. Lin, H.-C. Lin, J.-T. Lee, "Synthesis and electrochemical behaviour of nitroxide polymer brush thin-film electrodes for organic radical batteries", J. Mater. Chem. 2012, 22, pp. 1570-1577.
T. Janoschka, A. Teichler, A. Krieg, M. D. Hager, U. S. Schubert, "Polymerization of Free Secondary Amine Bearing Monomers by RAFT Polymerization and Other Controlled Radical Techniques", J. Polym. Sci., Part A: Polym. Chem. 2012, 50, pp. 1394-1407.
T. Suga, M. Sakata, K. Aoki, H. Nishide, "Synthesis of Pendant Radical- and Ion-Containing Block Copolymers via Ring-Opening Metathesis Polymerization for Organic Resistive Memory", ACS Macro Lett. 2014, 3, pp. 703-707.
T. W. Kemper, R. E. Larsen, T. Gennett, "Density of States and the Role of Energetic Disorder in Charge Transport in an Organic Radical Polymer in the Solid State", J. Phys. Chem. C 2015, 119, pp. 21369-21375.
J. Qu, T. Fujii, T. Katsumata, Y. Suzuki, M. Shiotsuki, F. Sanda, M. Satoh, J. Wada, T. Masuda, "Helical Polyacetylenes Carrying 2,2,6,6-Tetramethyl-1-piperidinyloxy and 2,2,5,5-Tetramethyl-1-pyrrolidinyloxy Moieties: Their Synthesis, Properties, and Function", J. Polym. Sci., Part A: Polym. Chem. 2007, 45, pp. 5431-5443.
J. T. Price, J. A. Paquette, C. S. Harrison, R. Bauld, G. Fanchini, J. B. Gilroy, "6-Oxoverdazyl radical polymers with tunable electrochemical properties", Polym. Chem. 2014, 5, pp. 5223-5226.
F. Zhang, C. Di, N. Berdunov, Y. Hu, Y. Hu, X. Gao, Q. Meng, H. Sirringhaus, D. Zhu, "Ultrathin Film Organic Transistors: Precise Control of Semiconductor Thickness via Spin-Coating", Adv. Mater. 2013, 25, pp. 1401-1407.
J. A. Paquette, S. Ezugwu, V. Yadav, G. Fanchini, J. B. Gilroy, "Synthesis, Characterization, and Thin-Film Properties of 6-Oxoverdazyl Polymers Prepared by Ring-Opening Metathesis Polymerization", J. Polym. Sci., Part A: Polym. Chem. 2016, 54, pp. 1803-1813.
G. Liu, B. Zhang, Y. Chen, C. X. Zhu, L. Zeng, D. S. H. Chan, K. G. Neoh, J. Chen, E. T. Kang, "Electrical conductivity switching and memory effects in poly(N-vinylcarbazole) derivatives with pendant azobenzene chromophores and terminal electron acceptor moieties", J. Mater. Chem. 2011, 21, pp. 6027-6033.
H. J. Yen, H. H. Tsai, C. Y. Kuo, W. Y. Nie, A. D. Mohite, G. Gupta, J. Wang, J. H. Wu, G. S. Liou, H. L. Wang, "Flexible memory devices with tunable electrical bistability via controlled energetics in donor-donor and donor-acceptor conjugated polymers", J. Mater. Chem. C 2014, 2, pp. 4374-4378.

* cited by examiner

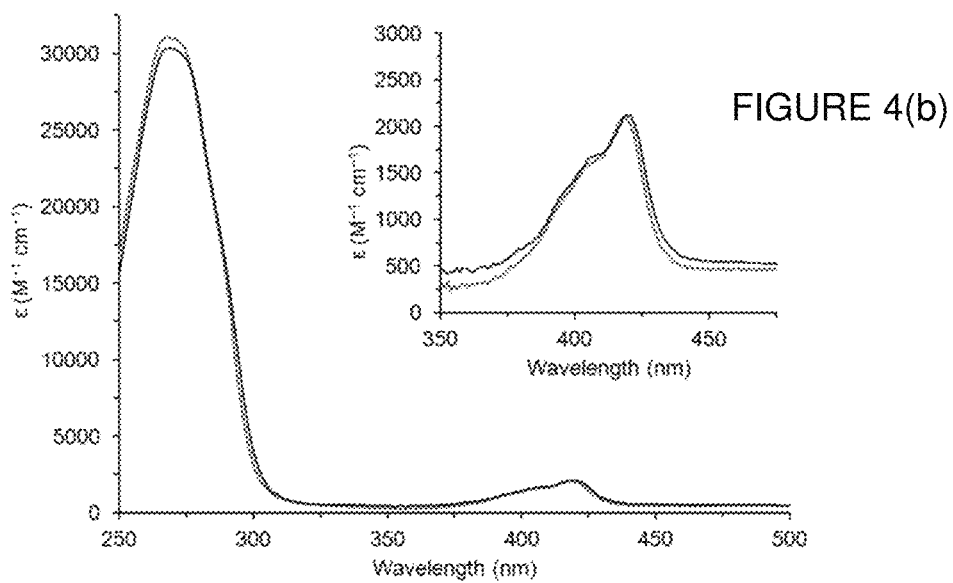
FIGURE 4(a)
FIGURE 4(b)
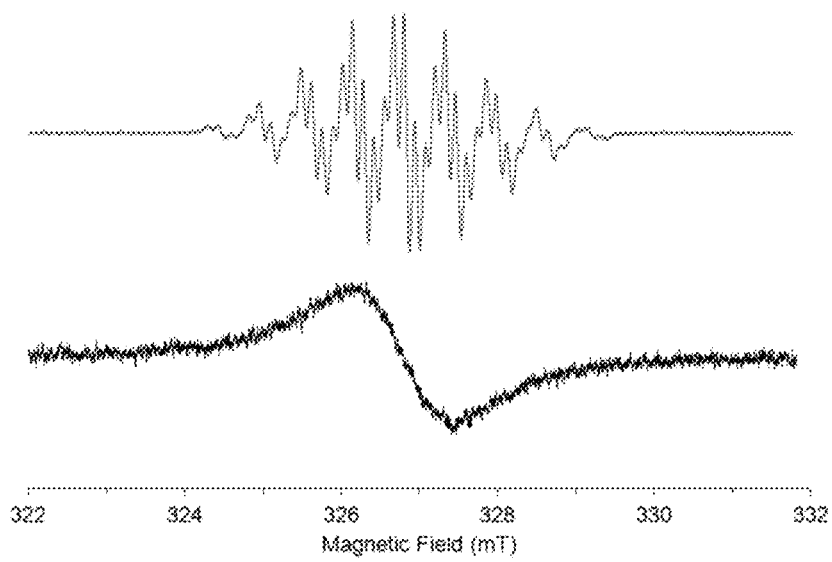
FIGURE 5

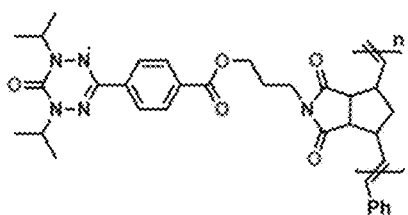 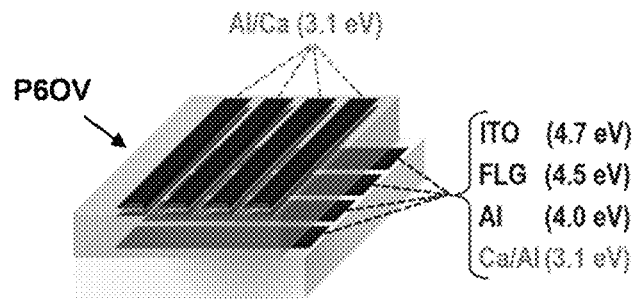
FIGURE 16(a)          FIGURE 16(b)
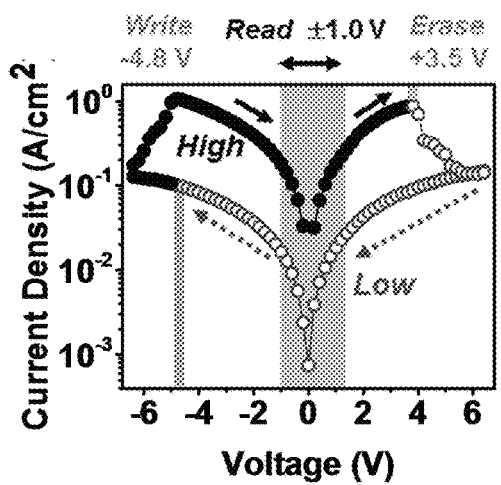
FIGURE 16(c)

US 10,538,618 B2

POLYMER BASED MEMRISTORS

FIELD

The present disclosure provides 6-oxoverdazyl polymer materials and memristors produced using these polymers.

BACKGROUND

Functional polymers with potentially useful optical and electronic properties have received significant attention due to the ability of these materials to improve upon existing technologies by combining the unique properties of small functional molecules (e.g., electron transfer, light absorption/emission, magnetic) with the processability, mechanical robustness, and flexibility associated with polymers. An interesting subclass of functional polymers that has emerged in recent years contain stable organic radicals[1] in the repeating unit pendant to their backbones.[2-4] The vast majority of research towards stable radical polymers has been motivated by their utility as electrode materials in batteries, where the introduction of conductive (nano)fillers has led to enhanced performance. However, radical polymers have also shown application as high-spin ground state materials, (co)catalysts for the selective oxidation of alcohols, inhibitors of self-polymerization reactions, solid-state conductive materials,[5-7] and the functional component of memory architectures.[8-10]

The most widely studied family of stable radical polymers is based on 2,2,6,6-tetramethyl-piperidin-1-yl (TEMPO, 1) radicals,[11-19] while examples based on other families of radicals, including nitronyl nitroxide (2),[20] 2,2,5,5-tetramethyl-1-pyrrolidinylloxy (PROXYL, 3),[21] spirobisnitroxide (4),[22] aminoxy (5),[23] galvinoxyl (6),[24] and 6-oxoverdazyl (7)[25] radicals have received considerably less attention (FIG. 1). Further expansion of the stable radical polymer field to include examples based on these and other stable radicals will allow for the realization of materials with targeted properties that are suitable for the applications described above. 6-Oxoverdazyl radicals offer exceptional stability towards air and moisture, and, while their high molecular weights render them poor candidates for battery applications, their tunable ambipolar redox properties may allow for their future use as charge transport materials.

Most synthetic protocols, for example those targeting nitroxide radical polymers, involve the polymerization of monomers based on radical precursors followed by post-polymerization reactions designed to generate the targeted stable radical polymers. These strategies are often hampered by difficulty surrounding the complete conversion of the radical precursor repeating units to their stable radical form, a factor that has recently been shown to affect their charge transport properties. Therefore, there remains a need for further development of polymerization protocols that allow for direct polymerization of stable radical-containing monomers and ensure a high degree of radical content along the polymer backbone.

Memory devices are a critical component in the field of information technology. They can be divided into volatile and nonvolatile, depending on the time for which they can retain the stored information. Volatile memory devices, including dynamic and static random access memory components, require stored data to be refreshed every few milliseconds. They cannot store data after the removal of the voltage used to write them. Most electronic systems require nonvolatile memory components for bootstrap and persistent data storage. To date, the most common nonvolatile memory components used in information and communication technology are devices that are writable once and readable multiple times (WORM). Flash memories that are writable, readable and erasable multiple times are more attractive, because they can be reused, but their costs are still high. Silicon-based flash devices consisting of a metal-oxide-semiconductor field effect transistor, with high k-dielectric oxides and an additional floating gate in each memory pixel, have been dominating the market of nonvolatile devices writable and erasable multiple times, but suffer from limited margins of improvement and high fabrication costs. Inorganic floating gates used to store the information cannot be less than 32 nm thick in such components.

Organic memristors, memory devices based on organic thin films with multistable resistivity characteristics, are being explored as possible substitutes for volatile, WORM and flash inorganic memory devices. They have the advantage of low fabrication costs and can be processed from organic compounds in solution. Although continuous organic thin films with thicknesses down to 10 nm have been demonstrated,[26] the minimum thickness that can be reached by organic "flash" memristors is still too high, at more than 15 nm. Proposed systems for organic memory devices include polyimide containing moieties, polymers containing metal complexes and non-conjugated polymers incorporating other organic materials (e.g., fullerenes, graphene oxide, carbazoles) directly and blended with polymers.

In most of these devices, two or more layers or phases are required, which poses insurmountable limitations to the ultimate thinness of the device. Flash memory devices comprising only a single layer of polymer are essential to keep their thickness to a minimum, and have been proposed. Another significant issue with organic memristors is to obtain stable flash effects, devices that are reproducibly writable a very large number of times. For instance, although memory devices based on radical polymers have been proposed,[8,17] their stability so far has been limited to a few writing cycles, in spite of the excellent quality of the active layer, which indicates that more fundamental knowledge of the physics of these devices is required.

SUMMARY

Disclosed herein are redox-active 6-oxoverdazyl polymers synthesized via ring-opening metathesis polymerization (ROMP) and their solution, bulk, and thin-film properties investigated. Detailed studies of the ROMP method employed confirmed that stable radical polymers with controlled molecular weights and narrow molecular weight distributions (Đ<1.2) were produced. Thermal gravimetric analysis of a representative example of the title polymers demonstrated stability up to 190° C., while differential scanning calorimetry studies revealed a glass transition temperature of 152° C. Comparison of the spectra of 6-oxoverdazyl monomer 12 and polymer 13, including FT-IR, UV-vis absorption, and electron paramagnetic resonance spectroscopy, was used to confirm the tolerance of the ROMP mechanism for the 6-oxoverdazyl radical both qualitatively and quantitatively. Cyclic voltammetry studies demonstrated the ambipolar redox properties of polymer 13 ($E_{1/2,ox}$=0.25 and $E_{1/2,red}$=−1.35 V relative to ferrocene/ferrocenium), which were consistent with those of monomer 12. An ultrathin memristor device was produced using one of these polymers, namely a 10 nm homogeneous thin film of poly-[1,5-diisopropyl-3-(cis-5-norbornene-exo-2,3-dicarboxiimide)-6-oxoverdazyl] (P6OV), a poly-radical with three tunable charge states per each radical monomer: positive, neutral and negative.

The present disclosure provides a 6-oxoverdazyl polymer, wherein the 6-oxoverdazyl polymer has a structure (S1);

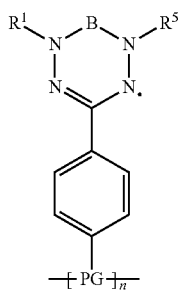

(S1)

in which

B is a bridging group which is any one of C=O, C=S, CH$_2$, and CHAr where Ar is a phenyl or substituted phenyl;

R$^1$ and R$^5$ are N-substituents which include any one of methyl, isopropyl, tertbutyl, phenyl, substituted phenyls, thiophene, furan, pyrrole, imidazole, pyridine, dimethylaminopyridine, pyrimidine, and indole;

PG is the polymerized form of a group, the group including any one of cis-5-norbornene-exo-2,3-dicarboximide, norbornene, substituted norbornenes, styrene, vinyl, alkynyl, acrylate, methacrylate, substituted silacyclobutanes, ethylene glycol, and ethylene oxide; and n is an integer equal to or greater than 1.

R$^1$ and R$^5$ may be identical, or R$^1$ and R$^5$ may be different.

The substituted phenyls may include phenyl rings bearing one or more methyl, methoxy, alcohol, amine, nitro, cyano, dimethylamino, fluoro, chloro, bromo, iodo, sulfoxy, carboxy, alkynyl, and alkenyl substituents.

The substituted phenyls may include 2-methylphenyl, 3-methylphenyl, 4-methylphenyl, 2-methoxyphenyl, 3-methoxyphenyl, 4-methoxyphenyl, 2-nitrophenyl, 3-nitrophenyl, 4-nitrophenyl, 2-cyanophenyl, 3-cyanophenyl, 4-cyanophenyl, 2-(dimethylamino)phenyl, 3-(dimethylamino)phenyl, 4-(dimethylamino)phenyl, 2-fluorophenyl, 3-fluorophenyl, 4-fluorophenyl, 2-chlorophenyl, 3-chlorophenyl, 4-chlorophenyl, 2-bromophenyl, 3-bromophenyl, 4-bromophenyl, 2-iodophenyl, 3-iodophenyl, 4-iodophenyl, 2-sulfoxyphenyl, 3-sulfoxyphenyl, 4-sulfoxyphenyl, 2-carboxyphenyl, 3-carboxyphenyl, 4-carboxyphenyl.

The substituted phenyls may include any one of methylphenyl, methoxyphenyl and nitrophenyl.

The polymerizable group PG may include any one of cis-5-norbornene-exo-2,3-dicarboximide, norbornene, substituted norbornenes, styrene, acrylate, methacrylate.

The R$^1$ and R$^5$ N-substituents may include any one of methyl, isopropyl, phenyl, methylphenyl, methoxyphenyl and nitrophenyl.

The integer n may be in a range from 1 to about 25,000.
The integer n may be in a range from 1 to about 1000.
The R$^1$ and R$^5$ may be isopropyl, and B may be C=O, and PG may be cis-5-norbornene-exo-2,3-dicarboximide, and n may be between 1 and about 100.

The present disclosure also provides a 6-oxoverdazyl polymer, wherein the 6-oxoverdazyl polymer has a structure (S2);

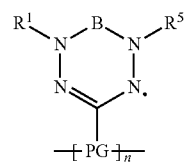

(S2)

in which

B is a bridging group which is any one of C=O, C=S, CH$_2$, and CHAr where Ar is a phenyl or substituted phenyl;

R$^1$ and R$^5$ are N-substituents which include any one of methyl, isopropyl, tertbutyl, phenyl, substituted phenyls, thiophene, furan, pyrrole, imidazole, pyridine, dimethylaminopyridine, pyrimidine, and indole;

PG is the polymerized form of a group, the group including any one of cis-5-norbornene-exo-2,3-dicarboximide, norbornene, substituted norbornenes, styrene, vinyl, alkynyl, acrylate, methacrylate, substituted silacyclobutanes, ethylene glycol, and ethylene oxide; and n is an integer equal to or greater than 1.

The R$^1$ and R$^5$ may be identical, or R$^1$ and R$^5$ may be different.

The substituted phenyls may include phenyl rings bearing one or more methyl, methoxy, alcohol, amine, nitro, cyano, dimethylamino, fluoro, chloro, bromo, iodo, sulfoxy, carboxy, alkynyl, and alkenyl substituents.

The substituted phenyls may include 2-methylphenyl, 3-methylphenyl, 4-methylphenyl, 2-methoxyphenyl, 3-methoxyphenyl, 4-methoxyphenyl, 2-nitrophenyl, 3-nitrophenyl, 4-nitrophenyl, 2-cyanophenyl, 3-cyanophenyl, 4-cyanophenyl, 2-(dimethylamino)phenyl, 3-(dimethylamino)phenyl, 4-(dimethylamino)phenyl, 2-fluorophenyl, 3-fluorophenyl, 4-fluorophenyl, 2-chlorophenyl, 3-chlorophenyl, 4-chlorophenyl, 2-bromophenyl, 3-bromophenyl, 4-bromophenyl, 2-iodophenyl, 3-iodophenyl, 4-iodophenyl, 2-sulfoxyphenyl, 3-sulfoxyphenyl, 4-sulfoxyphenyl, 2-carboxyphenyl, 3-carboxyphenyl, 4-carboxyphenyl.

The substituted phenyls may include any one of methylphenyl, methoxyphenyl and nitrophenyl.

The polymerizable group PG may include any one of cis-5-norbornene-exo-2,3-dicarboximide, norbornene, substituted norbornenes, styrene, acrylate, methacrylate.

The R$^1$ and R$^5$ N-substituents may include methyl, isopropyl, phenyl, methylphenyl, methoxyphenyl and nitrophenyl.

The integer n may be in a range from 1 to about 25,000.
The integer n may be in a range from 1 to about 1000.
The present disclosure provides memristors produced using compounds within S1 or S2, the memristor comprising:

a support substrate, a first array of electrodes or integrated circuit located on the support substrate;

a layer of a 6-oxoverdazyl polymer having the structure (S1) or (S2) located on said first electrode array, said layer having a thickness in a range from about 1 nm to about 1 µm;

a second array of electrodes or integrated circuit located on a top surface of the layer of a 6-oxoverdazyl polymer;

one of said first and second array of electrodes or integrated circuits being a cathode, said cathode having a work function in range of about 3 to about 6 eV, and the other array of electrodes being an anode, said anode having a work function in range of about 2 to about 5 eV.

The memristor may include bridging group B being C=O, R$^1$ and R$^5$ being one of isopropyl, phenyl, or substituted phenyl and wherein PG may be the polymerized form of group cis-5-norbornene-exo-2,3-dicarboximide, norbornene, substituted norbornenes, styrene, acrylate, methacrylate, substituted silacyclobutanes, ethylene glycol, and ethylene oxide, and wherein said cathode electrode has a work function in range of about 3.0 to about 4.8 eV.

The memristor anode electrode may have a work function in range of about 2.5 to about 3.5 eV.

The layer of 6-oxoverdazyl polymer may have a thickness in a range from about 1 nm to about 25 nm.

A further understanding of the functional and advantageous aspects of the present disclosure can be realized by reference to the following detailed description and drawings.

BRIEF DESCRIPTION OF THE DRAWINGS

Embodiments disclosed herein will be more fully understood from the following detailed description thereof taken in connection with the accompanying drawings, which form a part of this application, and in which:

FIG. 4(a) shows ultraviolet-visible (UV-vis) absorption spectra acquired for $CH_2Cl_2$ solutions of monomer 12 (grey line) and polymer 13 (black line).

FIG. 4(b) shows magnified spectra from 350 to 475 nm.

FIG. 5 shows experimental electron paramagnetic resonance (EPR) spectra of 6-oxoverdazyl monomer 12 (top, g=2.0045) and polymer 13 (bottom, g=2.0043). Simulation of the spectrum of monomer 12 yielded the following parameters: line width=0.089 mT, $a_{N1,3}$=0.529 mT, $a_{N2,4}$=0.640 mT, $a_H$=0.140 mT (FIG. 15).

FIG. 16(a) shows the molecular structure of P6OV with a 6-oxoverdazyl ring per each repeating unit.

FIG. 16(b) shows the memristor architecture used in this study.

FIG. 16(c) shows typical current density-voltage (J-V) characteristics of a device showing memory effects, in which the write ($V_W$), read ($V_R$) and erase ($V_E$) voltages are indicated. Arrows along the J-V curves indicate the scanning direction, starting from V=0. The open dots correspond to the low-conductivity regime (for V<0 until V=$V_W$ is reached). The solid dots correspond to the subsequent high-conductivity regime (for $V_W$<V<$V_E$). The system gradually reverts to the low-conductivity regime at V=$V_E$.

$E_{(0,\pi),(-)} > E_{\pi\pi^*}$ due to non-negligibility of the Hubbard energy U in the SOMO level. The SOMO becomes positively charged (+) when losing an electron, actually leading to $(0) \rightarrow (+,\pi^*)$ transitions, and becomes negatively charged (−) when gaining one electron, actually leading to $(0,\pi) \rightarrow (-)$ transitions.

Figure 17A:
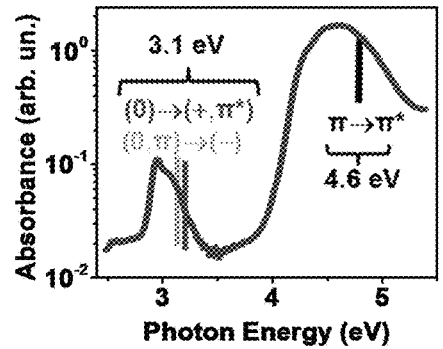
FIG. 17(a) shows the P6OV absorbance vs. photon energy. An intense absorption band at $E_{\pi\pi^*}$=4.6 eV is observed, which is assigned to π→π* interband transitions. Two less intense optical absorption bands at 3.1±0.1 eV are assigned to SOMO→LUMO and HOMO→SOMO transitions.
Figure 17B:
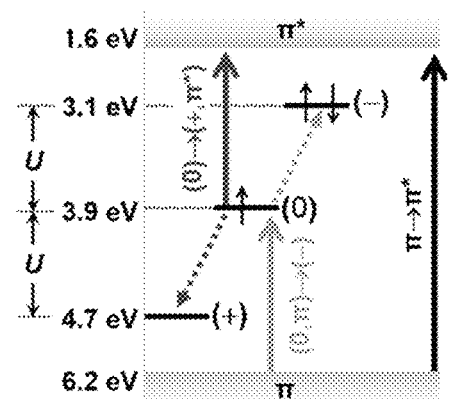
FIG. 17(b) shows a diagram of optical transition energies. The neutral SOMO level (0) sits close to mid-gap, which is corroborated by the closeness of SOMO→LUMO and HOMO→SOMO transition energies $E_{(0),(+,\pi^*)}$ and $E_{(0,\pi),(-)}$ (yellow and red lines in panel a). However, $E_{(0),(+,\pi^*)}$+
Figure 17C:
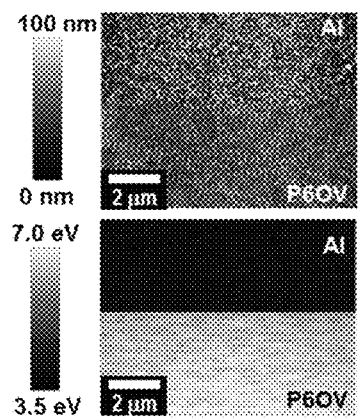

FIG. 17(c) shows AFM (top) and Kelvin-probe force microscopy (KPFM) (bottom) images P6OV film and nearby Al contact.

Figure 17D:
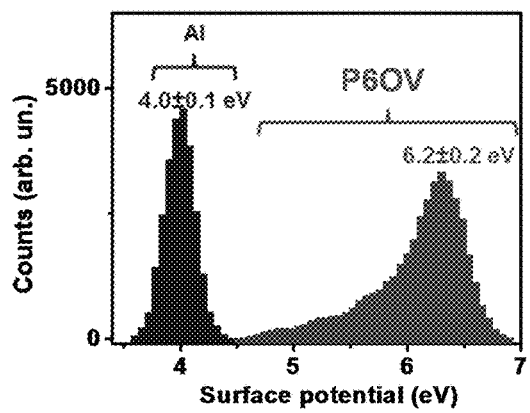

FIG. 17(d) shows a histogram of surface potential obtained from KPFM image in FIG. 17(c). The HOMO energy level of P6OV sits at $\varepsilon_\pi = 6.2 \pm 0.2$ eV below the vacuum level.

Figure 18A:
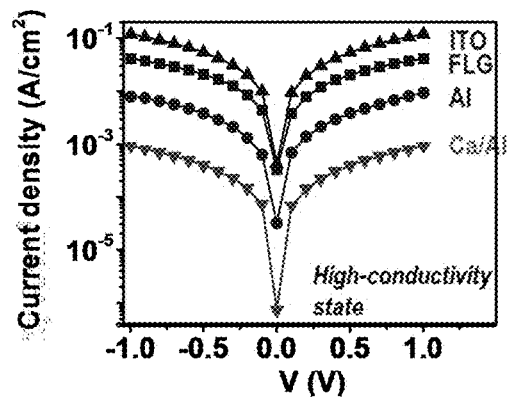

FIG. 18(a) shows current density vs. voltage characteristics of P6OV thin films as a function of the cathode material in a high-conductivity regime.

Figure 18B:
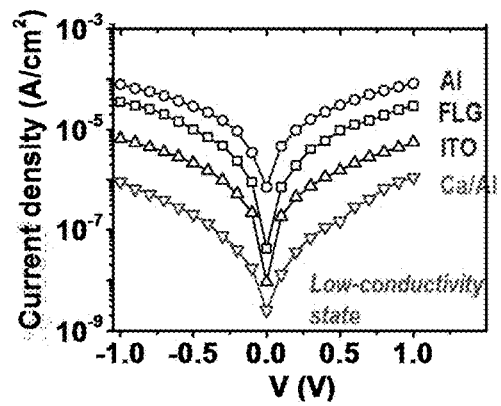

FIG. 18(b) shows current density vs. voltage characteristics of P6OV thin films as a function of the cathode material in a low-conductivity regime. Output currents are strongly dependent on the work function of the cathode material.

Figure 18C:
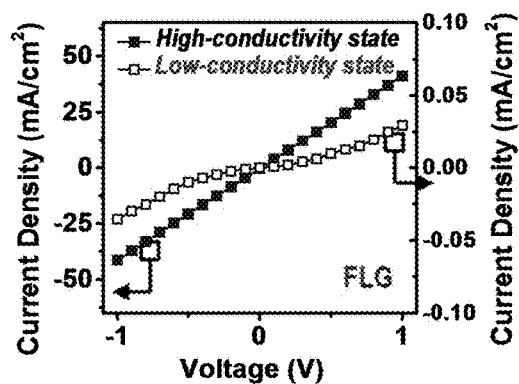

FIG. 18(c) shows high-conductivity and low-conductivity current densities of Al/Ca-P6OV-FLG devices, showing ohmic and Poole-Frenkel behavior in the high and low conductivity regimes, respectively.

Figure 18D:
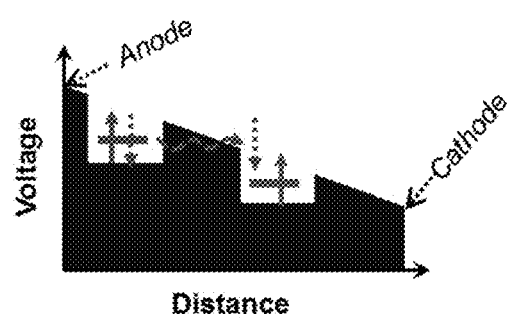

FIG. 18(d) shows a Poole-Frenkel model at moderate electric fields, which leads to hopping in the low-conductivity regime.

Figure 19A:
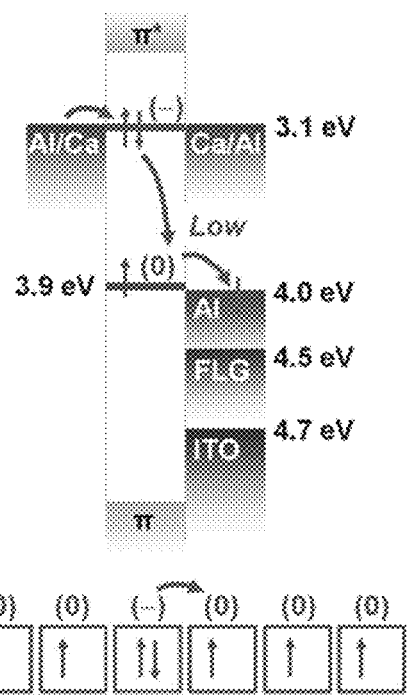

FIG. 19(a) shows an energy band diagram of P6OV-based memristors demonstrating optimized charge transport in a low-conductivity regime.

Figure 19B:
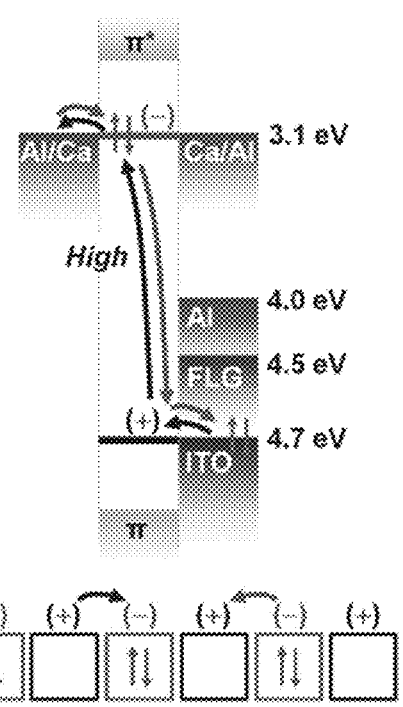

FIG. 19(b) shows an energy band diagram of P6OV-based memristors demonstrating optimized charge transport in a high-conductivity regime. In both FIGS. 19(a) and 19(b) energy bands in different memristor components are shown. Optimal charge injection in the low-conductivity regime occurs at 4.0 eV for electrons transferred to P6OV from the Al cathode. These electrons hop from monomer to monomer in a Poole-Frenkel transport mechanism (bottom left). In the high-conductivity regime, optimal hole injection occurs at 4.7 eV, when the cathode work function matches the $\varepsilon_{(+)}$ level of P6OV, and optimal electron injection occurs at 3.1 eV, when the anode work function matches the $\varepsilon_{(-)}$ level of P6OV. Simultaneous optimization of injection of electrons and holes is necessary to maximize extended state charge transport in the high-conductivity regime (bottom right).

Figure 20A:
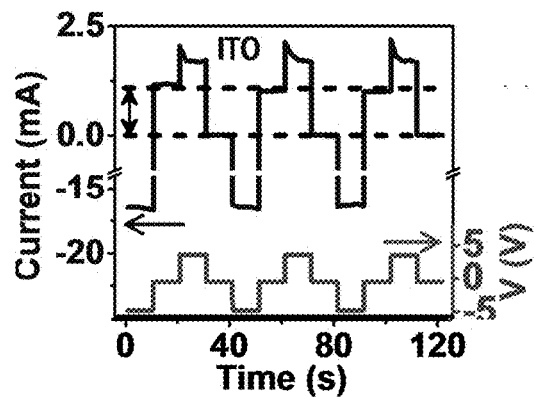
Figure 20B:
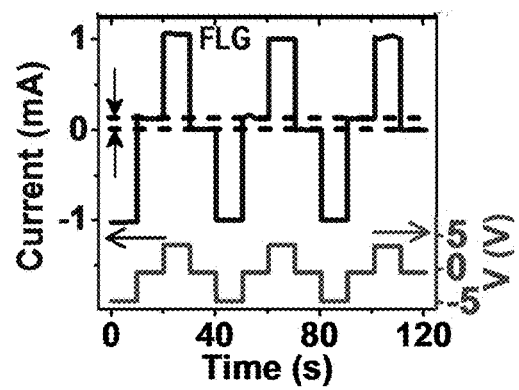
Figure 20C:
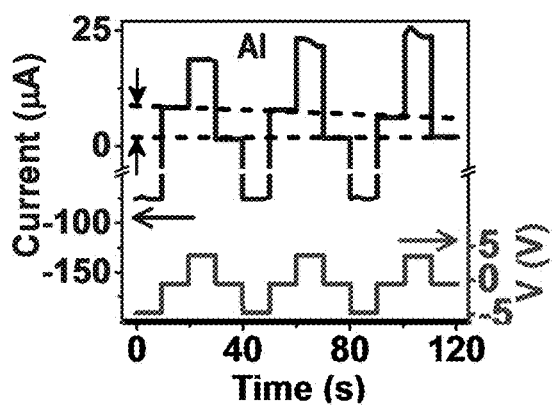
Figure 20D:
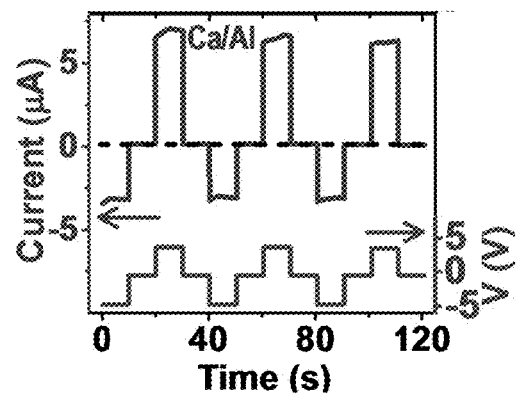

FIGS. 20(a) to 20(d) show measured output current (top curves) and corresponding applied voltages (red bottom curves) during multiple write-read-erase-read cycles of P6OV-based memristors with different cathode materials: FIG. 20(a) ITO; FIG. 20(b) FLG; FIG. 20(c) Al; and FIG. 20(d) Ca/Al. High-conductivity and low-conductivity states read at $V_R = +1$ 0.0 V are indicated by black dashed lines, from which the on/off current ratios can be inferred. The work function of the cathode (e.g., FLG and ITO) needs to be 4.5-4.7 eV, comparable to the energy level $\varepsilon_{(+)}$ of the positively charged polyradical, in order to produce stable on/off ratios and ensure flash effects. Cathode work functions of the order of $\varepsilon_{(0)} \approx 4$ eV, the energy level of the neutral SOMO of P6OV, produce WORM effects, e.g., with Al. No memory effects were observed with symmetric Ca/Al and Al/Ca electrodes.

Figure 21A:
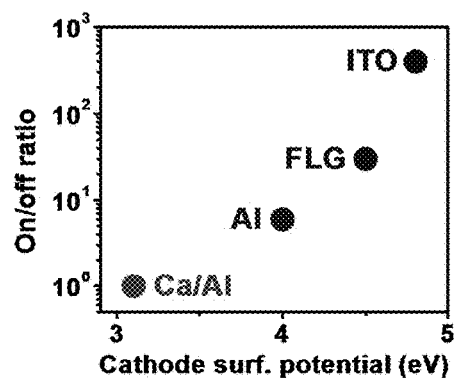

FIG. 21(a) shows on/off current ratio vs. device cathode surface potential. A high surface potential of the cathodes matching the positive charge state of P6OV are critical for high performance of the devices as shown in the optimized Al/Ca-P6OV-ITO memristor.

Figure 21B:
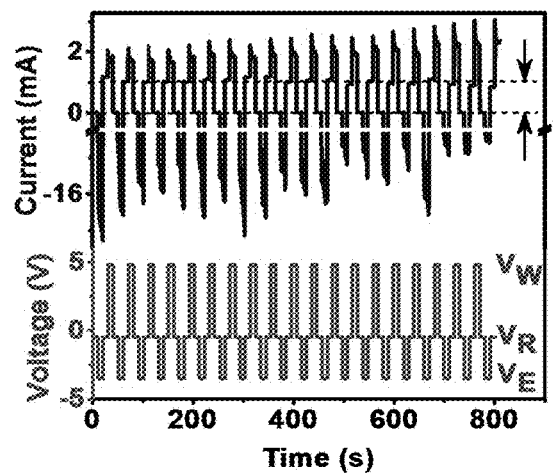

FIG. 21(b) shows the current response (top curve) and corresponding applied voltage (bottom curve) obtained during the stability test of Al/Ca-P6OV-ITO memristor under constant write-read-erase-read voltage cycles. High on/off current ratios $\sim 10^2$ at 1.0 V reading voltage were achieved in the optimized device, with high reproducibility over several tens cycles of write-read-erase-read.

Figure 22A:
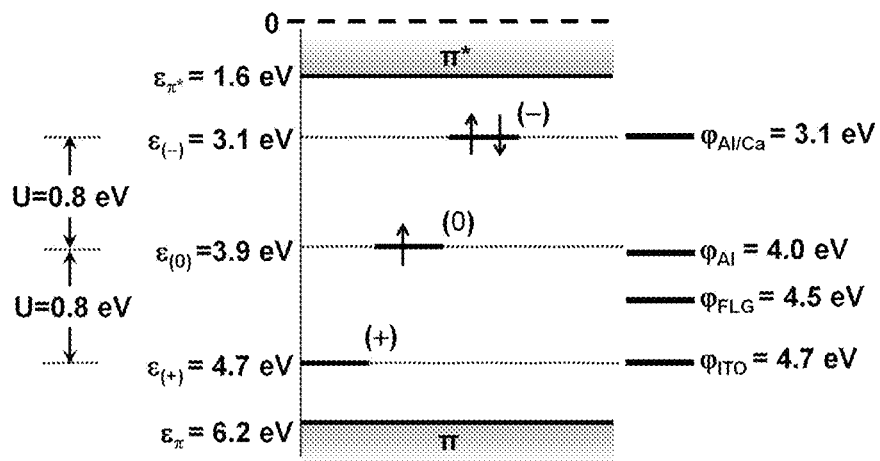

FIG. 22(a) shows a band diagram of P6OV showing the relative position of the electronic energy levels with their symbols (left side) and the position and symbols of the work functions of the metal electrodes (right side). The value and symbol of the Hubbard interaction energy is also indicated. The energy represented with (0) is the vacuum level so that the ε's—refers to energy levels relative to the vacuum level.

Figure 22B:
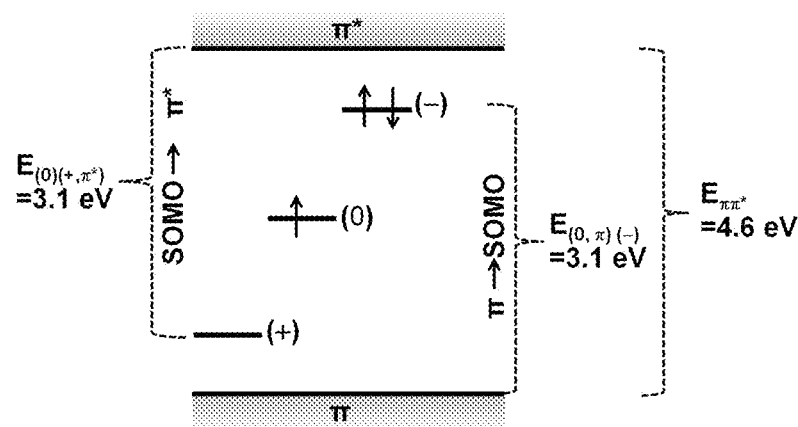

FIG. 22(b) shows band diagrams showing the allowed optoelectronic transitions in P6OV.

Figure 23:
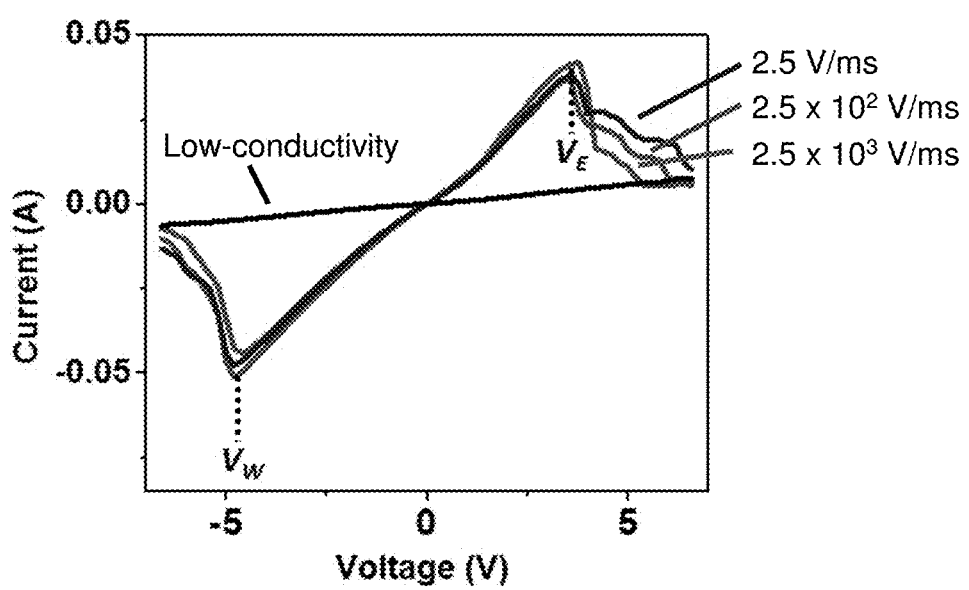

FIG. 23 shows the current-voltage characteristics of a device with Al/Ca-P6OV-ITO architecture. The write and erase voltages for transitions from low-conductivity to high conductivity state and vice versa are indicated and demonstrated to negligibly depend on the scan speed.

DETAILED DESCRIPTION

Various embodiments and aspects of the disclosure will be described with reference to details discussed below. The following description and drawings are illustrative of the disclosure and are not to be construed as limiting the disclosure. The drawings are not to scale. Numerous specific details are described to provide a thorough understanding of various embodiments of the present disclosure. However, in certain instances, well-known or conventional details are not described in order to provide a concise discussion of embodiments of the present disclosure.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions.

As used herein, the phrase "memristor" refers to a device capable of memorizing digital information that carries different levels of resistance depending on the amount of current, or voltage, that was previously applied to it.

As used herein, the phrase "integrated circuit" means a set of electronic circuits made up of various transistors on a single piece of semiconducting material (i.e., a chip). The integration of large numbers of transistors into a small chip will result in circuits that are orders of magnitude smaller, cheaper, and faster than those constructed for discrete electronic components (i.e., arrays of electrodes). In the organic electronics community this is a common term. Essentially the array of electrodes use in the characterization of the present memristors is for prototype purposes only. For integrated circuits, the integration of large numbers of tiny transistors into a small chip results in circuits that are orders of magnitude smaller, cheaper, and faster than those constructed for discrete electronic components. Therefore, any commercial application of the present memristors will require the use of integrated circuits.

As will be discussed below, memristors made using 6-oxoverdazyl polymers will be discussed. The memristors include a substrate, a first array of electrodes, or integrated circuit, laid down on the substrate, a thin 6-oxoverdazyl polymer layer formed on the first array of electrodes and a second array of electrodes, or integrated circuit, applied on the top surface of the 6-oxoverdazyl polymer film.

In an embodiment the present disclosure provides 6-oxoverdazyl polymers, having a structure (S1).

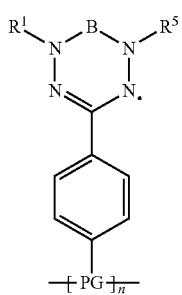

(S1)

in which B is a bridging group which is any one of C=O, C=S, $CH_2$, and CHAr, where Ar is a phenyl or substituted phenyl. $R^1$ and $R^5$ are N-substituents and these N-substituents may include any one of methyl, isopropyl, tertbutyl, phenyl, substituted phenyls, thiophene, furan, pyrrole, imidazole, pyridine, dimethylaminopyridine, pyrimidine, and indole.

Non-limiting examples of substituted phenyls in the bridging group B and the N-substituents $R^1$ and $R^5$ may include phenyl rings bearing one or more methyl, methoxy, alcohol, amine, nitro, cyano, dimethylamino, fluoro, chloro, bromo, iodo, sulfoxy, carboxy, alkynyl, and alkenyl substituents. Non-limiting specific examples of substituted phenyls that may be used include 2-methylphenyl, 3-methylphenyl, 4-methylphenyl, 2-methoxyphenyl, 3-methoxyphenyl, 4-methoxyphenyl, 2-nitrophenyl, 3-nitrophenyl, 4-nitrophenyl, 2-cyanophenyl, 3-cyanophenyl, 4-cyanophenyl, 2-(dimethylamino)phenyl, 3-(dimethylamino)phenyl, 4-(dimethylamino)phenyl, 2-fluorophenyl, 3-fluorophenyl, 4-fluorophenyl, 2-chlorophenyl, 3-chlorophenyl, 4-chlorophenyl, 2-bromophenyl, 3-bromophenyl, 4-bromophenyl, 2-iodophenyl, 3-iodophenyl, 4-iodophenyl, 2-sulfoxyphenyl, 3-sulfoxyphenyl, 4-sulfoxyphenyl, 2-carboxyphenyl, 3-carboxyphenyl and 4-carboxyphenyl.

PG is the polymerized form of a group, and the group may include any one of cis-5-norbornene-exo-2,3-dicarboximide, norbornene, substituted norbornenes, styrene, vinyl, alkynyl, acrylate, methacrylate, substituted silacyclobutanes, ethylene glycol, and ethylene oxide, n is an integer equal to or greater than 1. In some embodiments $R^1$ and $R^5$ may be identical in the polymer, however it will be understood that in some embodiments $R^1$ and $R^5$ may be different from each other.

In particular embodiments of the polymer the substituted phenyls include any one of methylphenyl, methoxyphenyl and nitrophenyl while the polymerizable group PG may include any one of cis-5-norbornene-exo-2,3-dicarboximide, norbornene, substituted norbornenes, styrene, acrylate, methacrylate, substituted silacyclobutanes, ethylene glycol, and ethylene oxide. Similarly, in particular embodiments the $R^1$ and $R^5$ N-substituents may include methyl, isopropyl, phenyl, methylphenyl, methoxyphenyl and nitrophenyl. The integer n may be in a range from 1 to about 25,000, but for many applications it is contemplated to be a range from 1 to 1000.

In an exemplary, non-limiting example, S1 may have $R^1$ and $R^5$ being isopropyl, and B is C=O, and wherein PG is cis-5-norbornene-exo-2,3-dicarboximide, and wherein n is between 1 and about 100, and the synthesis of this polymer 13 is illustrated hereinafter.

In another embodiment the 6-oxoverdazyl polymer has a structure (S2).

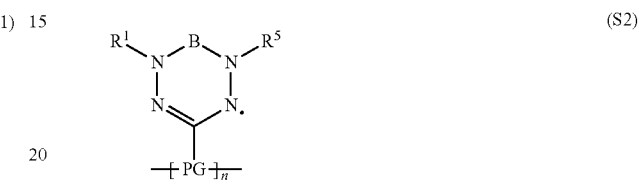

(S2)

The bridging group B, $R^1$ and $R^5$ N-substituents, the polymerized form of a group PG and the integer n may be the same as in structure (S1) with the only difference being structure (S2) is lacking the aromatic carbon ring structure between the PG group and the nitrogen ring structure. The inventors contemplate that polymers represented by structure (S1) are contemplated to have greater thermal and chemical stability than those represented by structure (S2). However, polymers represented by structure (S2) are expected to have a greater number of unpaired electrons per unit mass, potentially enhancing their resistive/conductive properties and charge storage capacity.

Non-limiting examples of 6-oxoverdazyl polymer structures represented by structure (S1), their methods of synthesis and their characterization will now be given.

EXAMPLE

Experimental
General

All reactions and manipulations were carried out under a nitrogen atmosphere using standard Schlenk techniques unless otherwise stated. Solvents were obtained from Caledon Laboratories, dried using an Innovative Technologies Inc. solvent purification system, collected under vacuum, and stored under a nitrogen atmosphere over 4 Å molecular sieves. All reagents were purchased from Sigma-Aldrich, Alfa Aesar, or Oakwood Chemicals and used as received unless otherwise stated. 2,4-Di-isopropylcarbonohydrazide bis-hydrochloride 8[27] and N-(3-hydroxylpropyl)-cis-5-norbornene-exo-2,3-dicarboximide 11[28] were prepared according to published procedures. NMR spectra were recorded on a 400 MHz ($^1$H: 400.1 MHz, $^{13}$C: 100.4 MHz) Varian INOVA instrument. $^1$H NMR spectra were referenced to residual $CD_3SOCD_2H$ (2.50 ppm) and $^{13}C\{^1H\}$ NMR spectra were referenced to $CD_3SOCD_3$ (39.5 ppm). Mass spectrometry data were recorded in positive-ion mode using a high resolution Finnigan MAT 8200 spectrometer using electron impact ionization. UV-vis absorption spectra were recorded in $CH_2Cl_2$ solutions using a Cary 300 Scan instrument. Four separate concentrations were run for each sample, and molar extinction coefficients were determined from the slope of a plot of absorbance against concentration. FT-IR spectra were recorded on a PerkinElmer Spectrum Two FT-IR as KBr pellets. Elemental analysis (C, H, N) was carried out by Laboratoire d'Analyse Élémentaire, Université de Montréal, Montréal, QC, Canada.

Gel Permeation Chromatography (GPC)

GPC experiments were conducted in chromatography grade THF at concentrations of 5 mg mL$^{-1}$ using a Viscotek GPCmax VE 2001 GPC instrument equipped with an Agilent PolyPore guard column (PL1113-1500) and two sequential Agilent PolyPore GPC columns packed with porous poly(styrene-co-divinylbenzene) particles (MW range 200-2,000,000 g mol$^{-1}$; PL1113-6500) regulated at a temperature of 30° C. Signal response was measured using a Viscotek VE 3580 RI detector, and molecular weights were determined by comparison of the maximum RI response with a calibration curve (10 points, 1,500-786,000 g mol$^{-1}$) established using monodisperse polystyrene purchased from Viscotek.

Thermal Analysis

Thermal degradation studies were performed using a TA Instruments 0600 SDT TGA and processed using TA Universal Analysis software. Samples were placed in an alumina cup and heated at a rate of 10° C. min$^{-1}$ tram 25 to 800° C. under a flow of nitrogen (100 mL min$^{-1}$). Glass transition temperatures were determined using differential scanning calorimetry (DSC) on a TA Instruments DSC 020. The polymer samples were placed in an aluminum Tzero pan and heated from room temperature to 180° C. at a scan rate of 10° C. min$^{-1}$ under a flow of nitrogen (50 mL min$^{-1}$) and cooled down to 0° C. at a scan rate 10° C. min$^{-1}$ before they underwent two more heating/cooling cycles. The glass transition temperature ($T_g$) was determined from the second heating/cooling cycle.

Cyclic Voltammetry (CV)

CV experiments were performed with a Bioanalytical Systems Inc. (BASi) Epsilon potentiostat and analyzed using BASi Epsilon software. Typical electrochemical cells consisted of a three-electrode setup including a glassy carbon working electrode, platinum wire counter electrode, and silver wire pseudo-reference electrode. Experiments were run at 100 mV s$^{-1}$ in degassed MeCN/CH$_2$Cl$_2$ (1:1) solutions of the analyte (~1 mM) and electrolyte (0.1 M nBu$_4$NPF$_6$). Voltammograms were referenced internally against the ferrocene/ferrocenium redox couple (~1 mM internal standard) and corrected for internal cell resistance using the BASi Epsilon software.

Electron Paramagnetic Resonance (EPR) Spectroscopy

EPR measurements were made on ca. 10$^{-5}$ M CH$_2$Cl$_2$ solutions of 6-oxoverdazyl monomer 12 and polymer 13 that had been subjected to three freeze-pump-thaw cycles in 0.4 mm quartz tubes using a JEOL JES-FA200 EPR spectrometer. All measurements were made at 20° C. and g-factors were referenced relative to a built-in manganese oxide marker within the resonant cavity of the instrument. Quantification of the number of unpaired electrons present in polymer 13 was done by comparing an EPR spectrum collected for a TEMPO solution of known concentration in CH$_2$Cl$_2$ that was compared to the manganese oxide marker signal as outlined above. The integration of the TEMPO signal with respect to the manganese oxide marker was compared to that of the radical polymer. By assuming one molecule of TEMPO contributes one unpaired electron, the number of unpaired electrons present in the radical polymer sample was determined.

X-ray Crystallography

Crystals of monomer 12 suitable for X-ray diffraction were grown by vapor diffusion of hexanes into a saturated CH$_2$Cl$_2$ solution at −30° C. The sample was mounted on a MiTeGen polyimide micromount with a small amount of Paratone N oil. All X-ray measurements were made on a Nonius KappaCCD Apex2 diffractometer at a temperature of 110 K. The frame integration was performed using SAINT[29]. The resulting raw data was scaled and absorption corrected using a multi-scan averaging of symmetry equivalent data using SADABS.[30] The structure was solved by using a dual space methodology using the SHELXT program[31]. All non-hydrogen atoms were obtained from the initial solution. The hydrogen atoms were introduced at idealized positions and the positional parameters but not the displacement parameters were allowed to refine. The structural model was fit to the data using full matrix least-squares based on F$^2$. The calculated structure factors included corrections for anomalous dispersion from the usual tabulation. The structure was refined using the SHELXL-2014 program from the SHELX suite of crystallographic software[32]. Graphic plots were produced using the Mercury program suite. See Table 1 and CCDC 1428231 for X-ray diffraction data collection and refinement details.

TABLE 1

Selected X-ray diffraction data collection and refinement details for monomer 12.

| Compound | 12 |
|---|---|
| Chemical Formula | C$_{27}$H$_{32}$N$_5$O$_5$ |
| Formula Weight (g mol$^{-1}$) | 506.57 |
| Crystal Dimensions (mm) | 0.349 × 0.325 × 0.115 |
| Crystal Color and Habit | Red prism |
| Crystal System | Triclinic |
| Space Group | P − 1 |
| Temperature (K) | 110 |
| a (Å) | 10.063(2) |
| b (Å) | 11.316(2) |
| c (Å) | 12.516(2) |
| α (°) | 100.839(4) |
| β (°) | 112.235(5) |
| γ (°) | 98.624(5) |
| V (Å$^3$) | 1257.0(4) |
| Z | 2 |
| ρ (g cm$^{-1}$) | 1.338 |
| λ (Å) | 1.54178 |
| μ (cm$^{-1}$) | 0.769 |
| Diffractometer Type | Nonius KappaCCD Apex2 |
| R$_{merge}$ | 0.0245 |
| R$_1$$^a$ | 0.0352 |
| ωR$_2$$^b$ | 0.0900 |
| R$_1$ (all data) | 0.0391 |
| ωR$_2$ (all data) | 0.0940 |
| GOF$^c$ | 1.028 |

$^a$R$_1$ = Σ(|F$_o$| − |F$_c$|)/Σ F$_o$
$^b$ωR$_2$ = [Σ(ω(F$_o$$^2$ − F$_c$$^2$)$^2$)/Σ(ωF$_o$$^4$)]$^{1/2}$
$^c$GOF = [Σ(ω(F$_o$$^2$ − F$_c$$^2$)$^2$)/(No. of reflns. − No. of params.)]$^{1/2}$ Thin-Film Preparation and Electrical Conductivity Measurements Thin films of various thickness were prepared from polymer 13 and their electrical properties were measured. Film preparation and electrical measurements were both carried out in a glove box loaded with N2 (Nexus II, Vacuum Atmospheres Co.) attached to an ultra-high vacuum (UHV) chamber for sample metallization and contacting. Samples can be transferred to/from this chamber from/to the glove box without any direct exposure to air. O$_2$ and H$_2$O contents in the glove box were below 3 ppm during the entire fabrication and measurement process. To prepare the thin films, the polymer was dissolved at 12.5 mg mL$^{-1}$ in anhydrous chlorobenzene. The solution was stirred overnight at 50° C., filtered through 0.8 μm pore size syringe filters and spun on glass substrates with pre-deposited indium tin-oxide (ITO) contacts (15 Ω/square sheet resistance, Sigma-Aldrich) using a KW-4A spin coater (Chemat Technologies Inc.) located in the glove box. ITO substrate patterning on glass was previously obtained by coating the ITO area to be retained with Kapton™ tape and etching the remaining area in a 2:1:1 $H_2O:HCl:HNO_3$ mixture at 55° C.

Figure 8A:
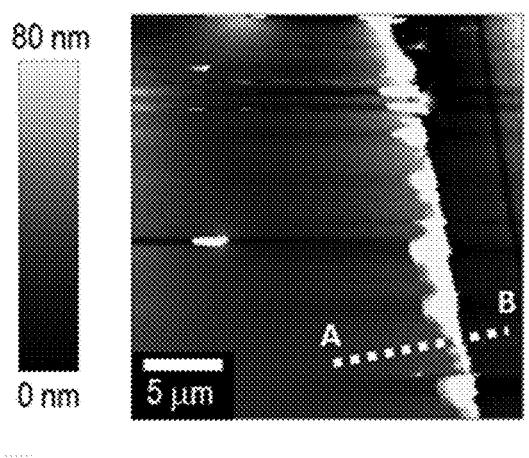
FIG. 8(a) shows atomic Force Microscopy (AFM) image of a 20 nm thin film of polymer 13 (left side of the image) and indium-tin oxide (ITO) substrate (right side of the image).
Figure 8B:
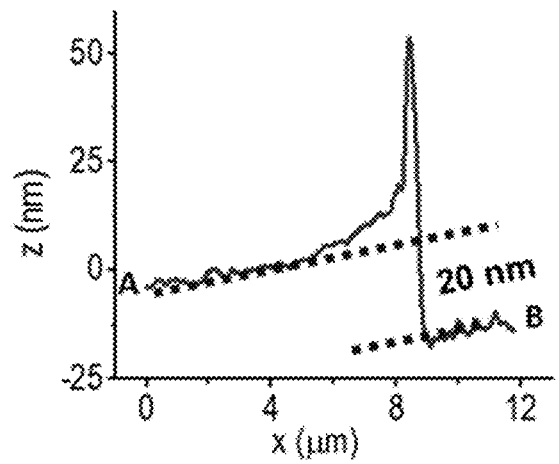
FIG. 8(b) shows the Z-axis profile of the "step" at the edge of polymer 13 used to determine the thin film thickness. From the right side of the profile, root mean squared (RMS) roughness of ITO could be estimated to be about 4 nm, much less than the polymer thickness, which is about 20 nm with an RMS roughness of about 2 nm, significantly less than the RMS roughness of ITO. This suggests the polymeric film is continuous with no outstanding ITO pinholes.

Different spinning speeds, from 500 to 3000 rpm, were used to obtain a set of thin films at thicknesses from 50±4 nm to 10±4 nm, respectively. These thicknesses were measured by atomic force microscopy (AFM) from samples identical to those used for electrical measurements. In order to perform the thickness measurements, part of the substrate was masked prior to spin coating the polymer solution. The mask was then removed and samples were extracted from the glove box and analyzed in contact-mode using a Witec Alpha300S AFM microscope, from which topography profiles of the step in the correspondence of the masked area were obtained. Additional AFM profiles were recorded in the correspondence of scratches made on the polymer film using soft probes that were known not to affect the substrate. Referring to FIGS. 8(a) and 8(b), AFM images showed that root mean squared (RMS) roughness of thin films of polymer 13 could be estimated to be about 2 nm, which was significantly less than the RMS roughness of ITO. This suggests the polymeric film is continuous with no outstanding ITO pinholes.

Electrical measurements were performed in a sandwich configuration in the glove box. To complete the sandwich structure, samples were transferred in the aforementioned UHV chamber directly accessible from the glove box and 100 nm thick aluminum contacts were thermally evaporated on top of the polymer films, with contact thickness measured in situ using a Sycom STM-2 thickness monitor. The temperature was kept below 50° C. during the entire thermal evaporation process. A first set of current voltage (I-V) characteristics of the thin films were recorded at ±1 V using a computer automated Keithley 2400 source meter with 10 mV scan step. After this set of measurements a significantly higher voltage, $V_o$=5 V, was applied to the samples, and electrical measurements were repeated. The breakdown voltage was determined to be 8-12 V for the thinnest sample and is therefore significantly higher than any voltages used during our experiments. Consistent electrical measurements were successfully reproduced on different sets of identical samples.

1,5-di-isopropyl-3-(4-carboxyphenyl)-6-oxotetrazane (9)

To a refluxing solution of 2,4-di-isopropylcarbazide (2.00 g, 8.09 mmol) and sodium acetate (1.33 g, 16.2 mmol) in MeOH (50 mL) was added dropwise over a 3 h period, a solution of 4-carboxybenzaldehyde (1.21 g, 8.09 mmol) and sodium acetate (0.66 g, 8.1 mmol) in MeOH (50 mL). The solution was stirred at reflux overnight, removed from the heat and allowed to cool to room temperature. The reaction mixture was then acidified to pH~3 using 1 M HCl, followed by the removal of MeOH in vacuo. The white precipitate that crashed out of the resulting aqueous solution was filtered and washed with two portions of deionized $H_2O$ (50 mL) to give tetrazane 9 as a white microcrystalline powder. Yield=2.34 g, 94%. $^1$H NMR (400.1 MHz, $d_6$-DMSO): δ 13.00 (s, 1H, COOH), 7.97 (d, 2H, $^3J_{HH}$=6 Hz, aryl CH), 7.68 (d, 2H, $^3J_{HH}$=6 Hz, aryl CH), 5.05 (d, 2H, $^3J_{HH}$=11 Hz, NH), 4.50-4.43 (m, 3H, NCHN and CHMe$_2$), 1.06-1.04 (m, 12H, CH$_3$). $^{13}$C {$^1$H}NMR (100.6 MHz, $d_6$-DMSO): δ 167.0, 153.4, 141.1, 130.6, 129.3, 126.9, 72.2, 46.8, 19.6, 18.4. FT-IR (ranked intensity, assignment), KBr pellet: 3249 (13, NH), 2981 (7), 2935 (11), 2872 (12), 1694 (3, CO), 1586 (1, CO), 1423 (2), 1227 (5), 1125 (6), - +ve mode): exact mass calculated for $C_{15}H_{22}N_4O_3$: 306.1692; found: 306.1688; difference: −1.3 ppm.

1,5-di-isopropyl-3-(4-carboxyphenyl)-6-oxoverdazyl (10)

To a deionized $H_2O$/THF (2:1, 45 mL) solution of 1,5-di-isopropyl-3-(4-carboxyphenyl)-6-oxotetrazane 9 (2.34 g, 7.64 mmol) and sodium hydroxide (0.31 g, 7.6 mmol) open to air was added sodium periodate (2.45 g, 11.5 mmol) in deionized $H_2O$ (30 mL) dropwise over 30 min. The reaction was stirred at room temperature for 18 h and slowly turned a dark red colour. The mixture was then acidified to pH~3 using 1 M HCl, followed by removal of THF in vacuo. The resultant dark-red precipitate was filtered and washed with two portions of deionized $H_2O$ (50 mL) to give verdazyl 10 as a red microcrystalline powder. Yield=2.15 g, 93%. FT-IR (ranked intensity, assignment), KBr pellet: 3434 (4, br, OH), 3198 (8), 2985 (6), 2937 (9), 1721 (3, CO), 1680 (1, CO), 1656 (2), 1612 (7), 1432 (12), 1386 (10), 1290 (11), 1219 (5) cm$^{-1}$. UV-vis (CH$_2$Cl$_2$): $\lambda_{max}$ 419 nm (ε=1,875 M$^{-1}$ cm$^{-1}$), 405 nm (ε=1,600 M$^{-1}$ cm$^{-1}$), 270 nm (ε=29,750 M$^{-1}$ cm$^{-1}$). Mass Spec. (EI, +ve mode): exact mass calculated for $C_{15}H_{19}N_4O_3$: 303.1457; found: 303.1459; difference: +0.7 ppm.

1,5-diisopropyl-3-(cis-5-norbornene-exo-2,3,-dicarboxiimide)-6-oxoverdazyl (12)

To a solution of N,N'-dicyclohexylcarbodiimide (DCC) (0.75 g, 3.6 mmol) and 4-dimethylaminopyridine (DMAP) (0.48 g, 4.0 mmol) in dry CH$_2$Cl$_2$ (20 mL) was added 1,5-di-isopropyl-3-(4-carboxyphenyl)-6-oxoverdazyl 10 (1.00 g, 3.30 mmol) before the mixture was stirred for 10 min at room temperature. To this solution was added N-(3-hydroxylpropyl)-cis-5-norbornene-exo-2,3-dicarboximide 11 (0.73 g, 3.3 mmol) and a further 10 mL of dry CH$_2$Cl$_2$ (for rinsing). The reaction mixture was stirred for 4 h at room temperature. The solution was filtered to remove salt, which was rinsed with dry CH$_2$Cl$_2$ before the organic phases were combined and taken to dryness in vacuo. The resulting orange oil was purified by column chromatography [75 mL neutral alumina, hexanes/EtOAc (35:65), $R_f$=0.45], and recrystallized from a hot saturated solution of hexanes to give 12 as dark-red needles. Yield=1.18 g, 71%. FT-IR (ranked intensity, assignment), KBr pellet: 2978 (11), 2935 (12), 2877 (14), 1770 (13, CO), 1697 (1, CO), 1679 (2, CO), 1611 (10), 1386 (9), 1367 (8), 1268 (2), 1230 (5), 1174 (6), 776 (7), 705 (4) cm$^{-1}$. UV-vis (CH$_2$Cl$_2$): $\lambda_{max}$ 418 nm (ε=1,900 M$^{-1}$ cm$^{-1}$), 403 nm (ε=1,400 M$^{-1}$ cm$^{-1}$), 268 nm (ε=31,025 M$^{-1}$ cm$^{-1}$). Mass Spec. (EI, +ve mode): exact mass calculated for $C_{27}H_{32}N_5O_5$: 506.2403; found: 506.2399; difference: −0.8 ppm. Anal. Calcd. (%) for $C_{27}H_{32}N_5O_5$: C, 64.02; H, 6.37; N, 13.82. Found: C, 63.88; H, 6.50; N, 13.65.

Representative Synthesis of poly[1,5-diisopropyl-3-(cis-5-norbornene-exo-2,3,-dicarboxiimide)-6-oxoverdazyl] (13)

A grease-free Schlenk flask was charged with monomer 12 (0.50 g, 0.99 mmol) and degassed CH$_2$Cl$_2$ (12 mL, 3 freeze-pump-thaw cycles). The monomer solution was cooled to 0° C. in an ice bath for 10 min before a 1 mg mL$^{-1}$CH$_2$Cl$_2$ solution of Grubbs' 3rd generation catalyst (8.73 mL, 9.87×10$^{-3}$ mmol) was rapidly added in one portion. The polymerization proceeded for 1 h before it was terminated with ethyl vinyl ether (2.37 mL, 24.7 mmol), and stirred for an additional 30 min while warming to room temperature. The crude mixture was filtered through a short neutral alumina column (4 cm×2.5 cm, $CH_2Cl_2$) before the solvent was removed in vacuo. The resultant polymer, an orange oil was dissolved in THF (10 mL) and precipitated thrice into cold hexanes (90 mL) to afford 13 as an orange powder. Yield=0.46 g, 92%. FT-IR (ranked intensity, assignment), KBr pellet: 2975 (13), 2939 (14), 2871 (16), CO ester 1775 (15), 1698 (1, CO), 1682 (2, CO), 1611 (12), 1387 (10), 1368 (8), 1270 (3), 1228 (9), 1173 (6), 1104 (7), 1101 (5), 776 (11), 705 (4) $cm^{-1}$. UV-vis ($CH_2Cl_2$): $\lambda_{max}$ 419 nm ($\epsilon$=2,050 $M^{-1}$ $cm^{-1}$), 402 nm ($\epsilon$=1,475 $M^{-1}$ $cm^{-1}$), 270 nm ($\epsilon$=29,900 $M^{-1}$ $cm^{-1}$). GPC (THF, conventional calibration relative to polystyrene standards): $M_n$=46,100 g $mol^{-1}$, $M_w$=49,000 g $mol^{-1}$, Đ=1.07).

Kinetic Studies of the ROMP of Monomer 12
Catalyst Loading:

Using 0.05 g of monomer 12 each, a series of five reactions were carried out according to the procedure described above. The catalyst molar feed stock ratios (monomer:catalyst) were: 20, 40, 60, 80, and 100. The polymerization times were held constant at 30 min. The degree of polymerization was measured by GPC analysis using conventional calibration relative to polystyrene standards.

Timed Aliquots:

A 1 mg $mL^{-1}$ $CH_2Cl_2$ solution of Grubbs' $3^{rd}$ generation catalyst (3.5 mL, 4.0×$10^{-3}$ mmol) was rapidly added in one portion to a 42 mg $mL^{-1}$ $CH_2Cl_2$ solution of monomer 12 (4.8 mL, 0.40 mmol) and the mixture was stirred at 0° C. Six samples were taken at 150 s intervals and added into separate reaction flasks containing ethyl vinyl ether (0.94 mL, 9.9 mmol) to terminate polymerization. The number average molecular weights ($M_n$) were measured by GPC analysis using conventional calibration relative to polystyrene standards.

Results and Discussion
Synthesis

Figure 9:
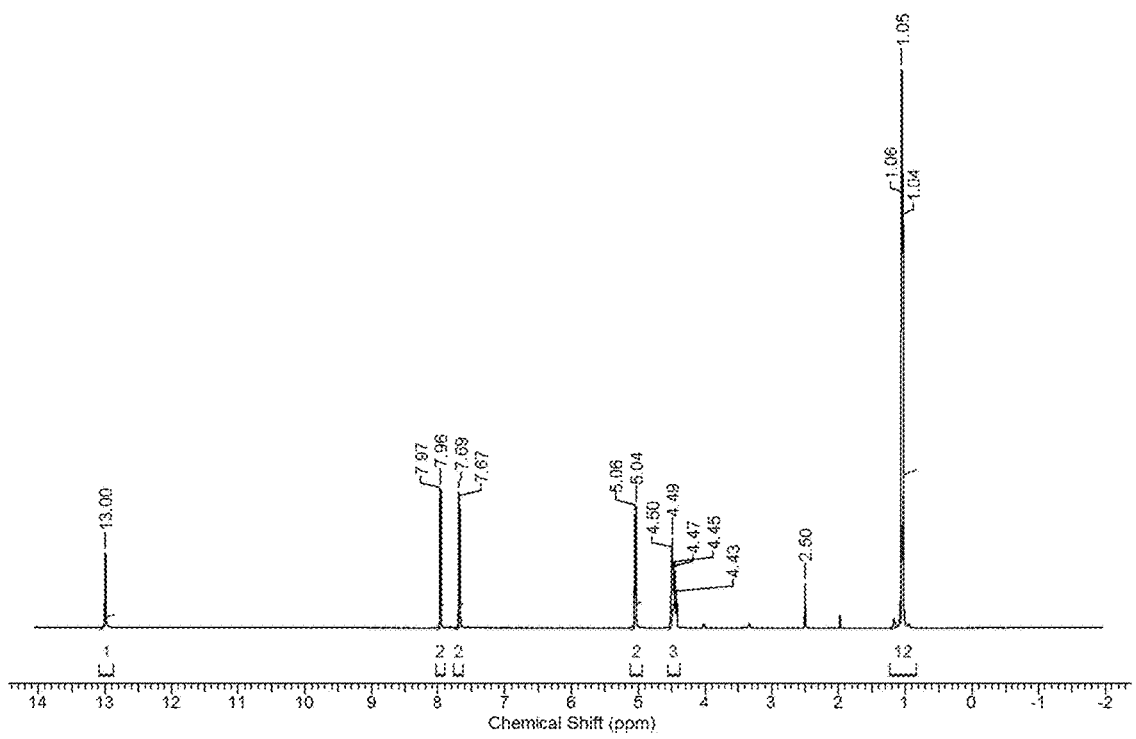
FIG. 9 shows the $^1H$ nuclear magnetic resonance (NMR) spectrum of tetrazane 9 in $d_6$-DMSO in which the asterisk denotes residual $CD_3SOCD_2H$.
Figure 10:
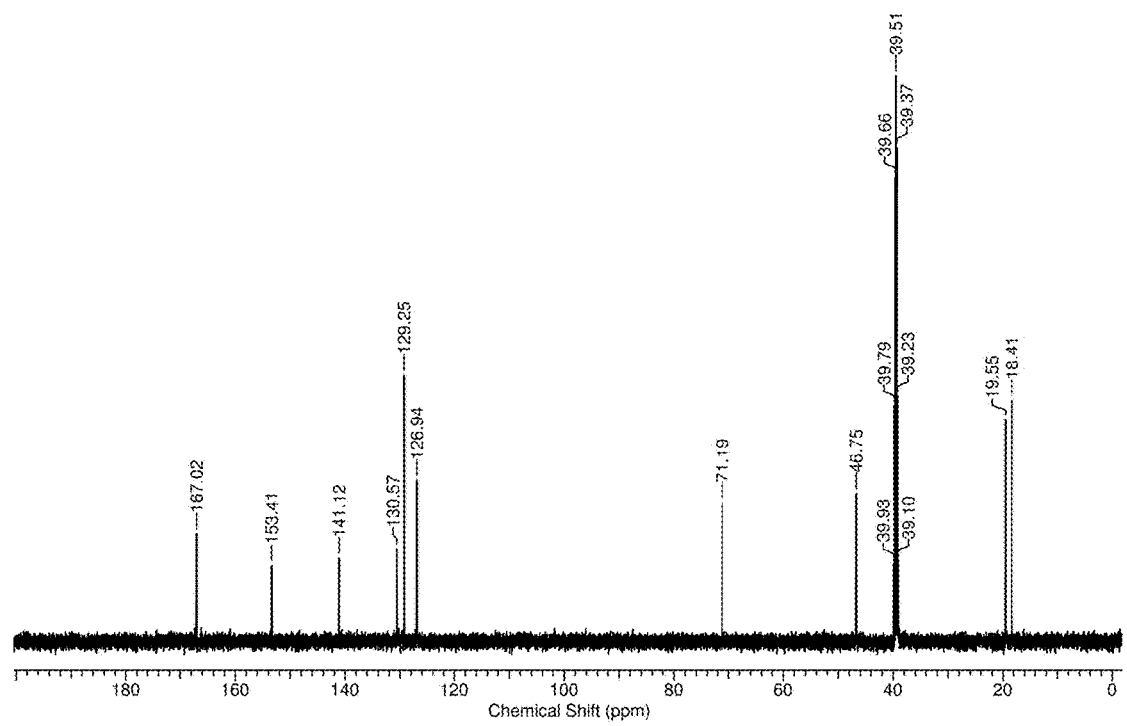
FIG. 10 shows the $^{13}C\{^1H\}$ NMR spectrum of tetrazane 9 in $d_6$-DMSO in which the asterisk denotes $d_6$-DMSO.
Figure 11:
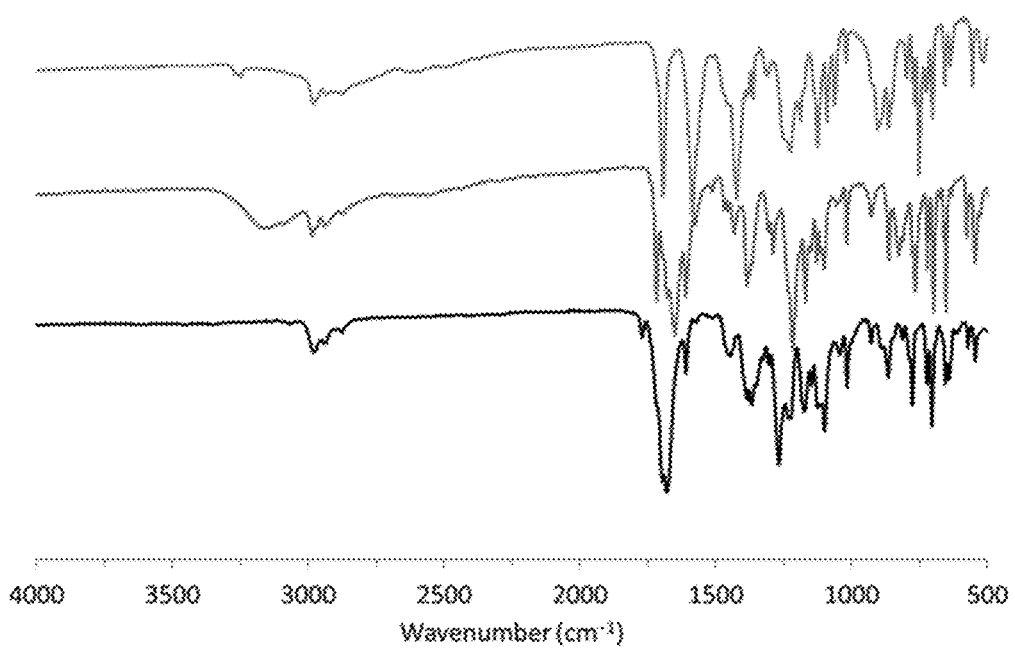
FIG. 11 shows the Fourier transform infrared (FT-IR spectra of tetrazane 9 (top), 6-oxoverdazyl 10 (middle), and monomer 12 (bottom). The baselines have been offset for ease of comparison. Note the disappearance of the stretch at 3249 cm$^{-1}$ upon oxidation of tetrazane 9 to verdazyl 10, and the disappearance of the broad COOH stretch at 3434 cm$^{-1}$ after the DCC coupling reaction (10→12).

The synthesis of monomer 12 (Scheme 1) began with the condensation reaction between bis-hydrazide×2HCl salt 8 and 4-formylbenzoic acid to afford tetrazane 9 as a white powder in 94% yield (see FIGS. 9 and 10). Tetrazane 9 was then oxidized in THF/deionized $H_2O$ solution using sodium periodate to yield 6-oxoverdazyl 10 as an orange powder (93%). The reaction was monitored by FT-IR spectroscopy where the disappearance of the NH stretch at 3249 $cm^{-1}$ was observed (see FIG. 11). Verdazyl 10 was then coupled to N-(3-hydroxylpropyl)-cis-5-norbornene-exo-2,3-dicarboxi- mide 11 in the presence of DCC and DMAP to afford monomer 12 as dark-red crystals in 71% yield. The isopropyl-substituted cis-5-norbornene-exo-2,3-dicarboximide polymerizable group was chosen based on previous reports by Tang and co-workers describing the successful ROMP of monomers bearing redox-active cobaltocenium moieties.

SCHEME 1 Synthesis of 6-oxoverdazyl monomer 12 and polymer 13 (a specific embodiment of S1)

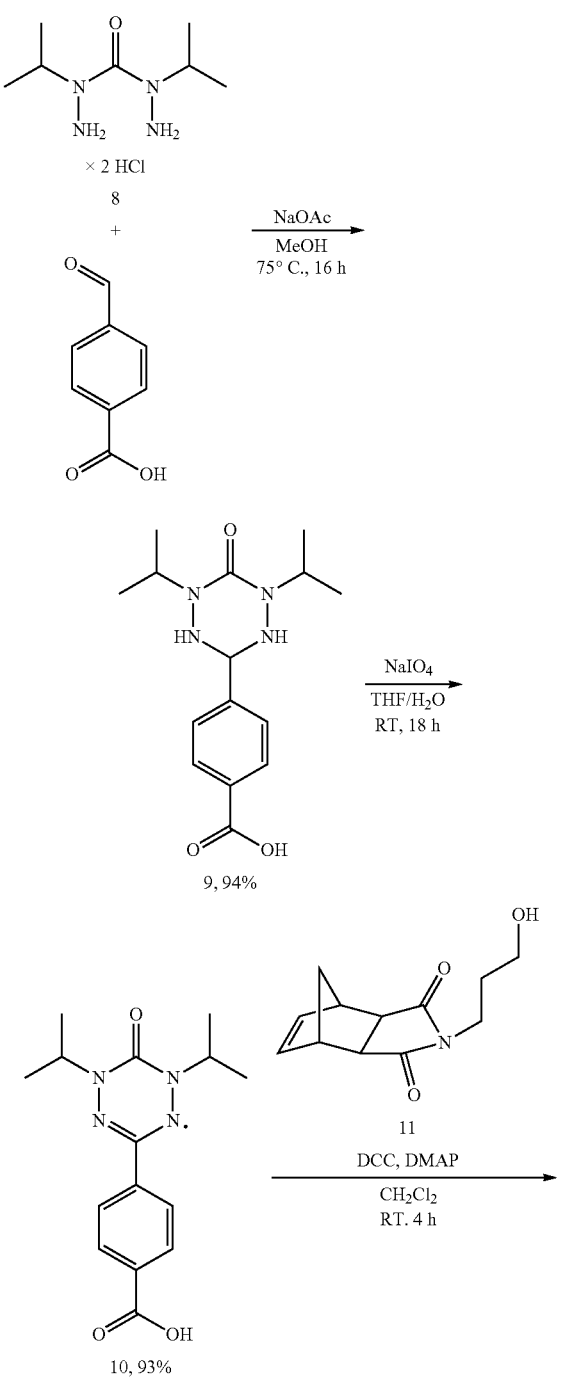

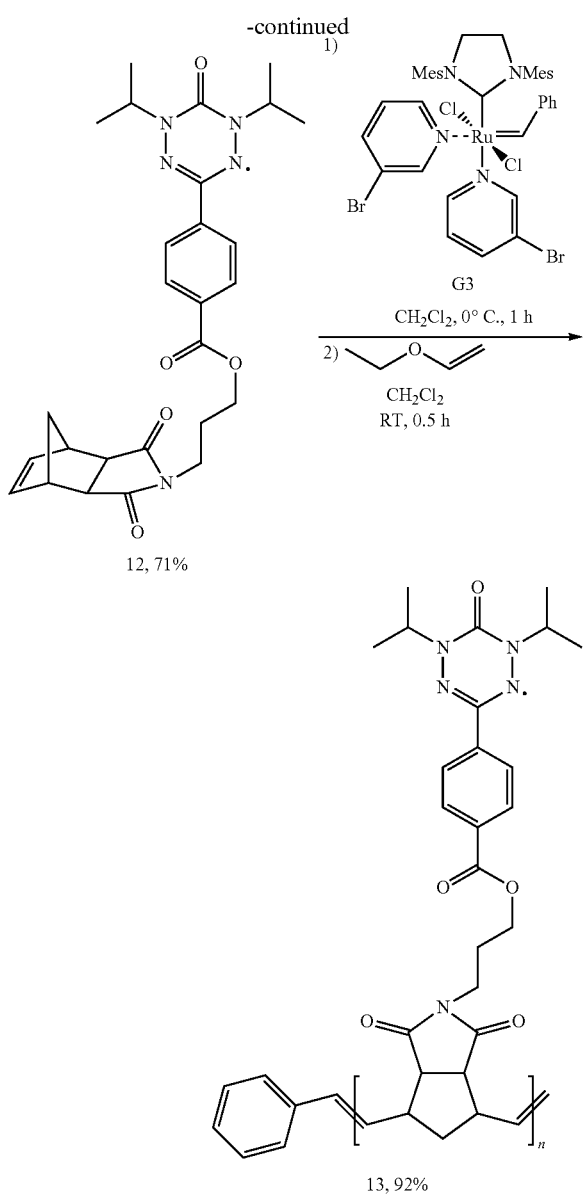

Figure 1:
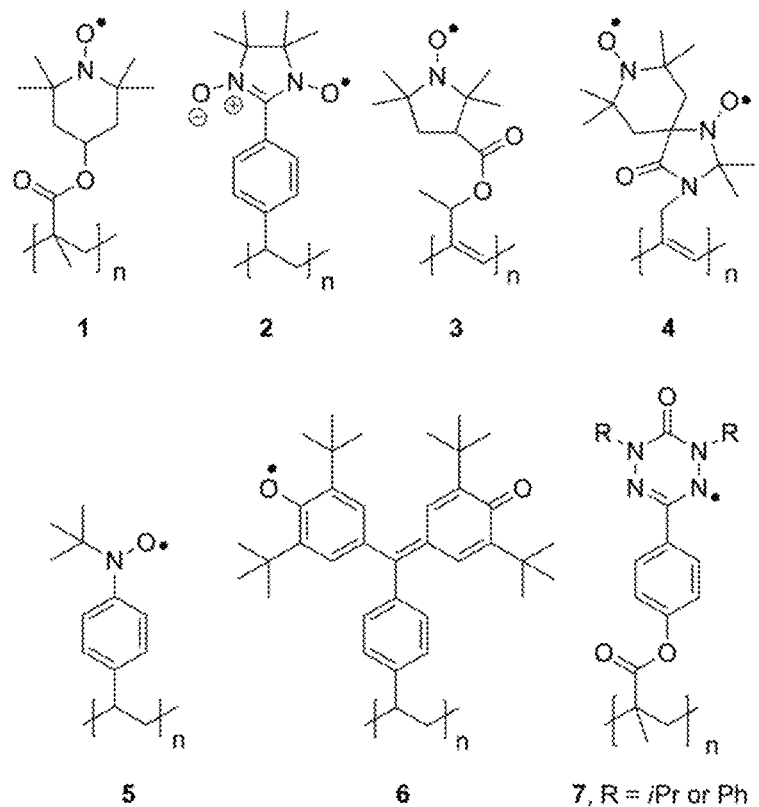
FIG. 1 shows the chemical structures of representative examples of known stable radical polymers.
Figure 2:
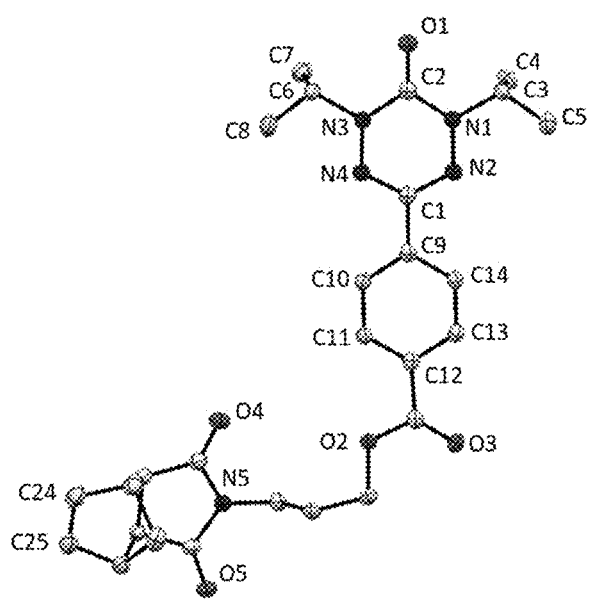
FIG. 2 shows the solid-state structure of monomer 12. Anisotropic displacement ellipsoids are shown at 50% probability and hydrogen atoms have been omitted for clarity. Selected bond lengths (Å): N1-N2 1.3558(15), N3-N4 1.3595(15), N1-C2 1.3819(16), N2-C1 1.3319(16), N3-C2 1.3802(16), N4-C1 1.3315(16), C24-C25 1.318(2). Selected bond angles (deg): N1-N2-C1 115.00(10), N3-N4-C1 114.96(10), N1-C2-N3 114.35(11), N2-C1-N4 127.20(11).

X-ray diffraction studies of single crystals of monomer 12 afforded a solid-state structure (FIG. 2 and Table 1). The bond lengths of N1-N2 1.3558(15) and N3-N4 1.3595(15) Å are intermediate between single and double N—N bonds. Similarly, the N2-C1 1.3319(16) and N4-C1 1.3315(16) Å bond lengths fall between those expected for single and double N—C bonds, confirming the delocalized nature of the bonding in the planar verdazyl radical. The dihedral angle between the verdazyl plane (N1-N2-C1-N4-N3-C2) and the plane defined by the phenyl ring (C9-C14) was found to be 6.13°. Furthermore, the bond length of C24-C25 of 1.318(2) Å is consistent with the preservation of the alkene in the norbornene ring. The structural metrics observed for verdazyl monomer 12 are consistent with those of other 6-oxoverdazyl radicals.

Figure 3A:
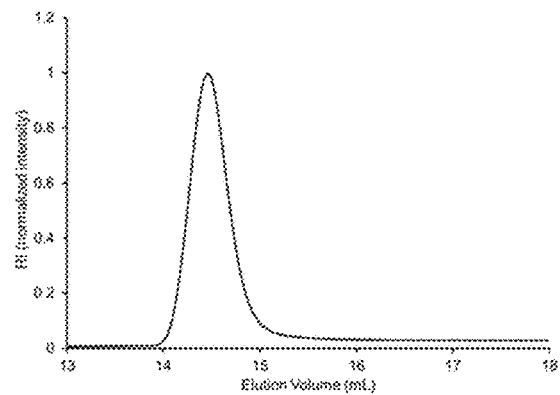
FIGS. 3(a) and 3(b) show representative gel permeation chromatography (GPC) traces for: 3(a) a typical sample of polymer 13 ($M_n$=46,100 g mol$^{-1}$, $M_w$=49,300 g mol$^{-1}$, Đ=1.07); and 3(b) a GPC trace for a polymer containing a minor fraction of high molecular weight polymer 13 ($M_n$=51,100 g mol$^{-1}$, $M_w$=57,750 g mol$^{-1}$, Đ=1.13).

With monomer 12 in hand, we began to explore its ROMP behavior. In a representative reaction, polymerization was initiated by the rapid introduction of a solution of Grubbs' 3rd generation catalyst (G3) to a stirring solution of monomer 12 in dry and degassed $CH_2Cl_2$ at 0° C. with a feed molar ratio of 100 (monomer:catalyst=100:1). Reaction progress was monitored by gel permeation chromatography (GPC), confirming the reaction was near completion after approximately 15 min. Nonetheless, the solution was stirred for an additional 45 min to ensure complete monomer conversion before a large excess of ethyl vinyl ether (EVE) was added to terminate the polymerization. The reaction mixture was passed through a plug of neutral alumina to remove residual catalyst. Subsequent precipitations from THF into cold hexanes, followed by centrifugation afforded polymer 13 as an orange powder in 92% yield. FIG. 3(a) shows the GPC trace (typical) obtained for polymer 13 after purification [number average molecular weight ($M_n$)=46,100 g mol$^{-1}$, weight average molecular weight ($M_w$)=49,300 g mol$^{-1}$, dispersity (Đ)=1.07]. Our best results were obtained when $CH_2Cl_2$ was employed as a solvent, while Nishide and co-workers have recently noted improved results when acetone was employed as solvent for the ROMP of a related bis nitroxide monomer.

Figure 3B:
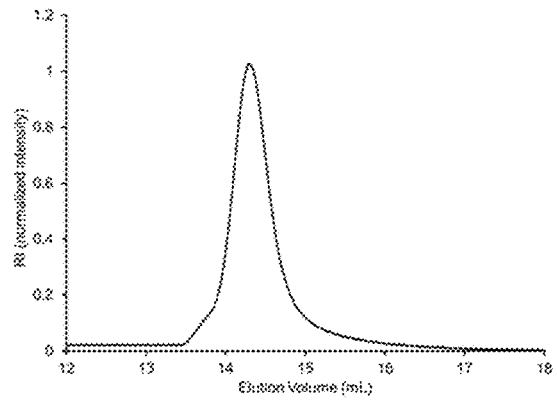

It is worth noting that during our investigations of the ROMP of monomer 12, approximately 20% of our reactions yielded polymer samples that contained a high molecular weight shoulder in their GPC chromatograms (e.g., FIG. 3(b), $M_n$=51,100 g mol$^{-1}$, $M_w$=57,750 g mol$^{-1}$, Đ=1.13). Based on the inconsistent appearance of this shoulder in our GPC data, we assume that the high molecular weight species are generated via chain coupling or related reactions during the termination step. The origin of the coupling remains unclear, however, molecular oxygen inadvertently introduced when EVE was introduced to the reaction flask via syringe may play a role in the observed reactivity.

Figure 3C:
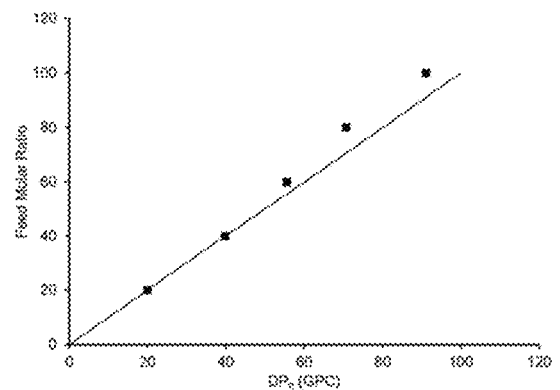
FIG. 3(c) shows the relationship of feed molar ratio and $DP_n$ determined by GPC. The line represents the theoretical relationship between $DP_n$ and feed molar ratio.
Figure 3D:
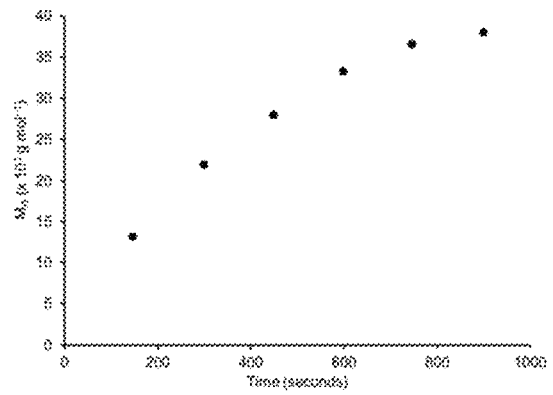
FIG. 3(d) shows molecular weight ($M_n$) as a function of reaction time.

The inventors performed two separate experiments designed to further probe the ROMP of monomer 12. The scope of the present studies were limited due to the paramagnetic nature of polymer 13, which precluded the use of integration data obtained from $^1$H NMR spectroscopy for the determination of the number average degree of polymerization ($DP_n$) and monomer consumption as a function of time. The first study involved ROMP of monomer 12 at five different molar feedstock ratios (FIG. 3(c)). As expected, the values of $DP_n$ determined by GPC analysis increased significantly as the molar feedstock ratios were increased from 20 to 100. However, when high molecular weight polymers were targeted, a deviation from ideal behavior was observed, and lower than expected values of $DP_n$. This observation is indicative of well-behaved, but not formally living polymerization ROMP. A second study was performed, where a single ROMP reaction (monomer:catalyst 100:1) was studied at time intervals of 150 s (FIG. 3(d)). The molecular weight of the isolated polymers increased in a non-linear fashion as a function of time due to a decrease in monomer concentration as the reaction proceeded. Again, this trend was consistent with a well-behaved ROMP reaction involving limited side reactions.

Polymer Characterization

Figure 12:
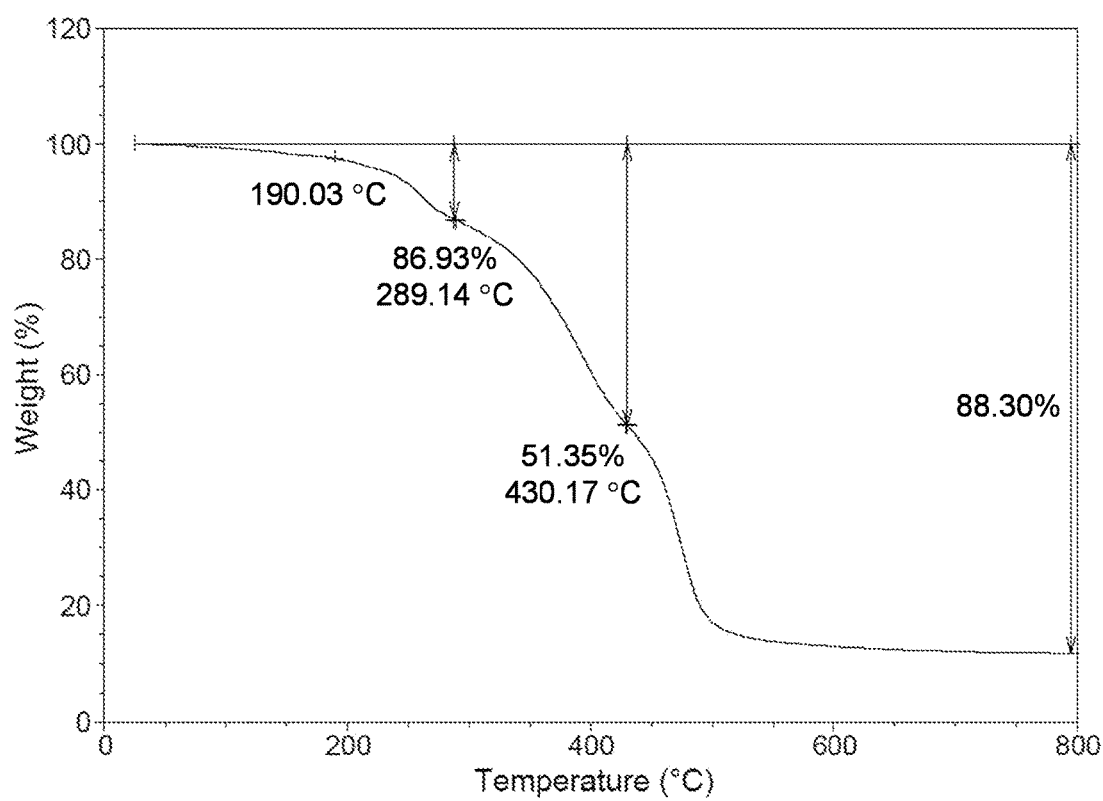
FIG. 12 shows a thermal gravimetric analysis (TGA) trace for 6-oxoverdazyl polymer 13 from 25 to 800° C.
Figure 13:
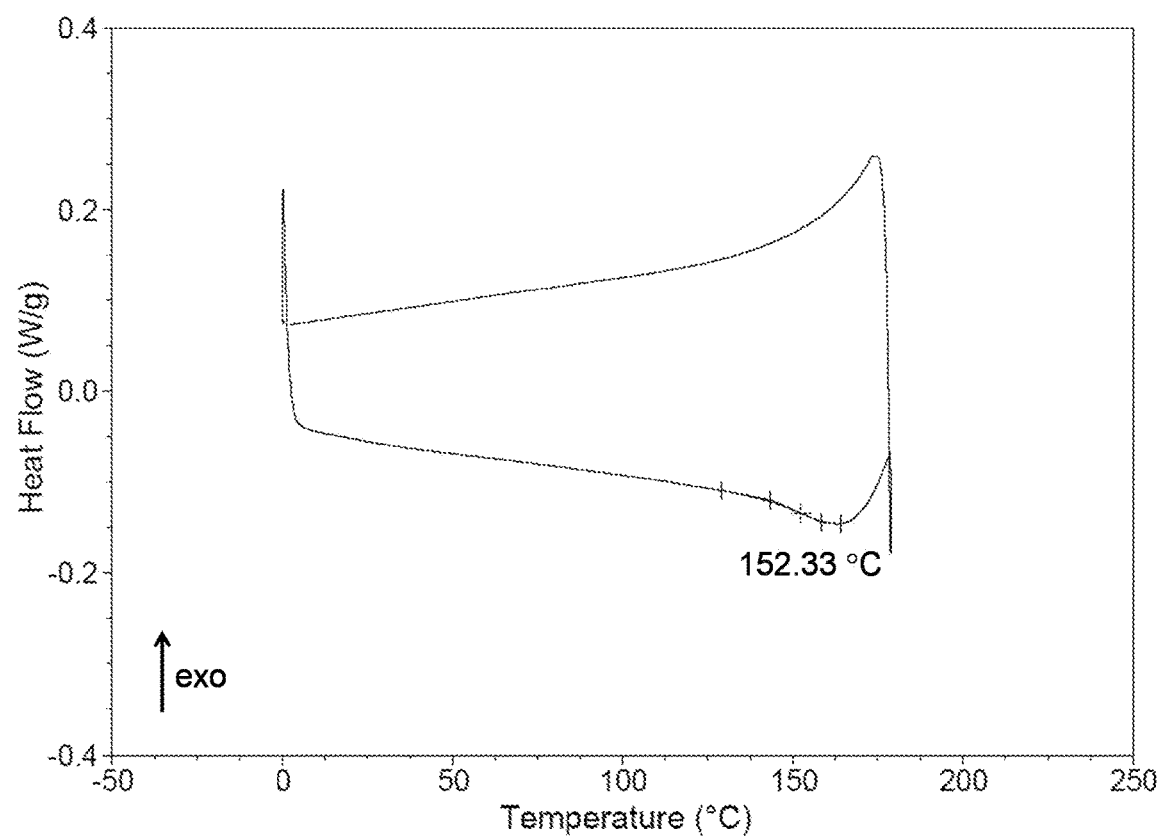
FIG. 13 shows differential scanning calorimetry (DSC) data (second heating/cooling cycle) for 6-oxoverdazyl polymer 13. The sample was heated to 180° C. followed by cooling to 0° C. at a rate of 10° C. min$^{-1}$.

Thermal gravimetric analysis (TGA) revealed that polymer 13 was thermally stable up to a temperature of 190° C., where rapid degradation occurred in three steps (see FIG. 12). The first step (190-290° C.) involved a mass loss of 13%, the second (290-430° C.) 35%, and the third (430-800° C.) 40%, to give an overall char yield of 12%. Differential scanning calorimetry (DSC) studies of polymer 13 revealed a $T_g$ of 152° C. (see FIG. 13).

Figure 14:
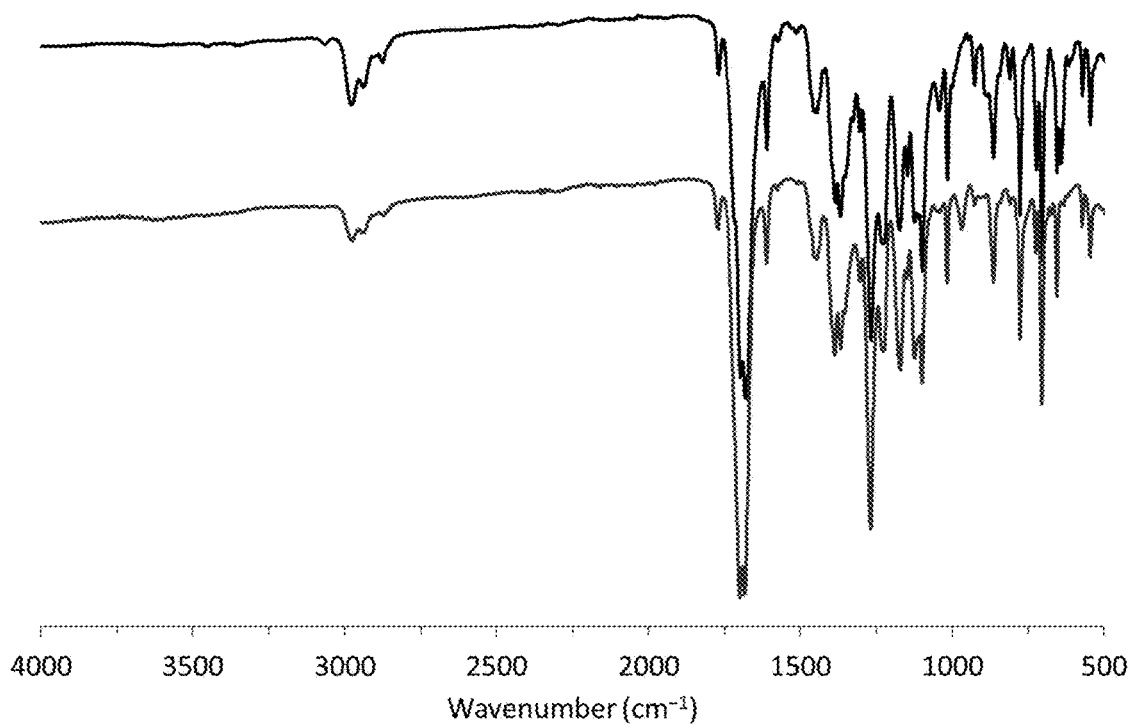
FIG. 14 shows FT-IR spectra of 6-oxoverdazyl monomer 12 (bottom) and polymer 13 (top). Baselines have been offset for ease of comparison.

To confirm the presence of 6-oxoverdazyl radicals in the polymer, careful comparison of the spectroscopic and electrochemical properties of monomer 12 and polymer 13 were made. FIG. 14 shows FT-IR spectra of 6-oxoverdazyl monomer 12 (bottom) and polymer 13 (top). Baselines have been offset for ease of comparison. The FT-IR spectra of monomer 12 showed characteristic carbonyl peaks at 1679,1697, 1770 cm$^{-1}$ similar to the carbonyl peaks at 1682,1698, and 1775 cm$^{-1}$ of polymer 13. Moreover, when we compared the UV-vis absorption spectra of monomer 12 and polymer 13 between 350 and 475 nm, we found that they were in very close agreement (see FIGS. 4(a) and 4(b)). Based on the IR and UV-vis absorption spectra, we conclude that nearly 100% of the repeating units in polymer 13 contain a 6-oxoverdazyl moiety, indicating that the ROMP reaction employed is indeed tolerant of such radicals.

In order to further support these findings, electron paramagnetic resonance (EPR) spectroscopy was performed to quantitatively determine the number of unpaired 6-oxoverdazyl units present in polymer 13. This experiment showed that ca. 94% of the repeating units in the polymer contain an unpaired electron, supporting our IR and UV-vis absorption spectroscopy-based claims discussed above. An EPR spectrum of monomer 12 was also obtained and compared to the spectrum of polymer 13 (FIG. 5).

Figure 15:
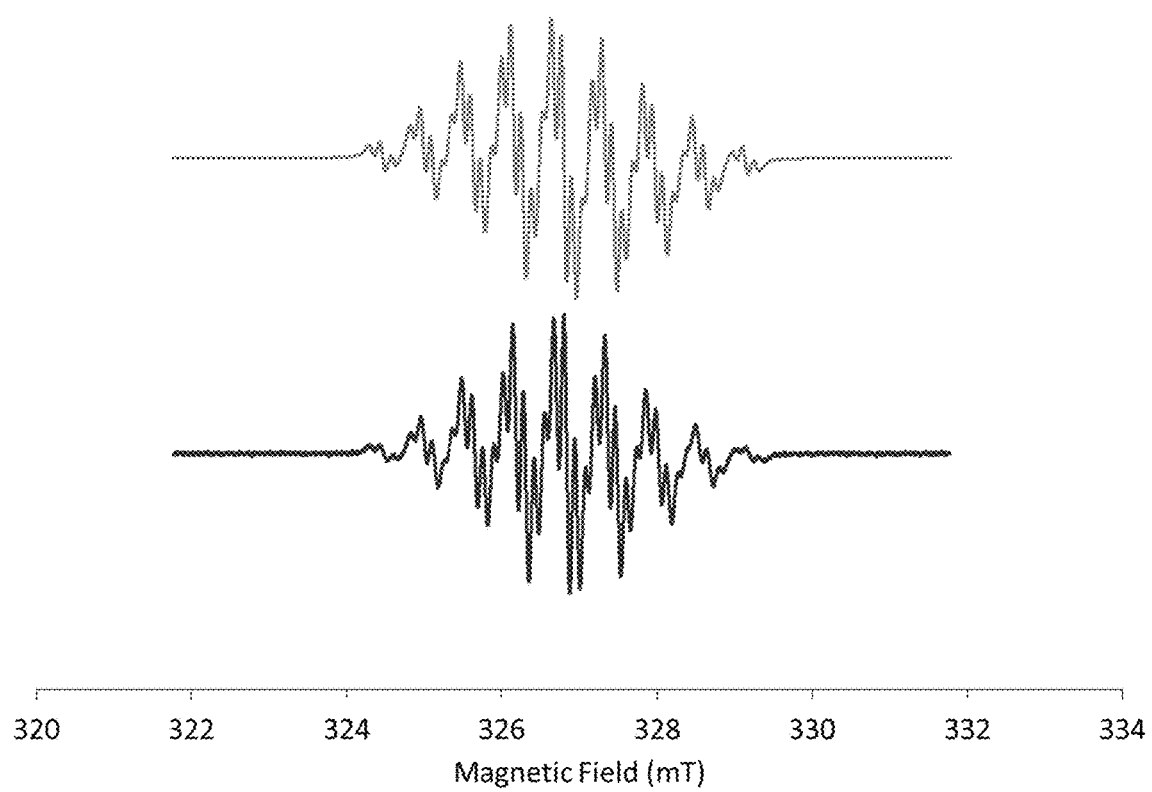
FIG. 15 shows simulated (top) and experimental (bottom) EPR spectra of 6-oxoverdazyl monomer 12 in $CH_2Cl_2$. Parameters for simulation: g=2.0045, line width=0.089 mT, $a_{N1,3}$=0.529 mT, $a_{N2,4}$=0.640 mT, $a_H$=0.140 mT.

FIG. 15 shows simulated (top) and experimental (bottom) EPR spectra of 6-oxoverdazyl monomer 12 in $CH_2Cl_2$. Parameters for simulation: g=2.0045, line width=0.089 mT, $a_{N1,3}$=0.529 mT, $a_{N2,4}$=0.640 mT, $a_H$=0.140 mT. The spectrum of monomer 12 showed a typical pattern for 1,5-substituted 6-oxoverdazyls,[41] with the radical coupling to two unique pairs of nitrogen atoms and the CH protons of the isopropyl groups [simulation data seen in FIG. 15]: g=2.0045, line width=0.089 mT, $a_{N1,3}$=0.529 mT, $a_{N2,4}$=0.640 mT, $a_H$=0.140 mT]. The isotropic EPR spectrum of polymer 13 (g=2.0043) was very broad and essentially featureless, as would be expected for a polymer containing stable radicals in random orientations and close proximity.

Figure 6:
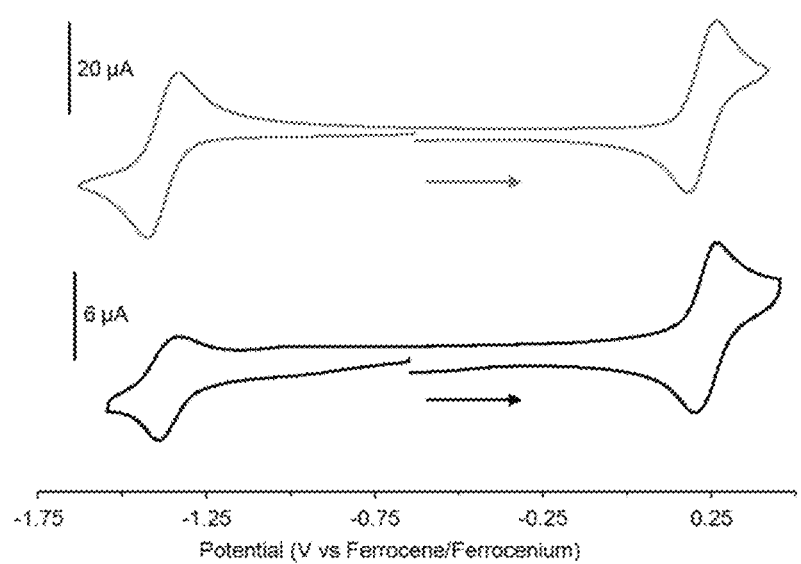
FIG. 6 shows cyclic voltammograms (CV) of 6-oxoverdazyl monomer 12 (top) and polymer 13 (bottom) recorded at a scan rate of 100 mV s$^{-1}$ in $CH_2Cl_2$/MeCN (1:1) solution containing 1 mM analyte and 0.1 M $nBu_4NPF_6$ as supporting electrolyte.

The electrochemical properties of monomer 12 and polymer 13 were studied using cyclic voltammetry (CV) in a $CH_2Cl_2$/MeCN (1:1) solvent mixture (FIG. 6, Table 2). 6-Oxoverdazyl monomer 12 was reversibly oxidized and reduced at half-wave oxidation ($E_{1/2,ox}$) and reduction ($E_{1/2,red}$) potentials of 0.24 and −1.36 V relative to the ferrocene/ferrocenium redox couple, respectively. Similarly, the CV of polymer 13 showed oxidation and reduction wave potentials at 0.25 V and −1.35 V, respectively. The current response for the polymer was lower than expected and the oxidation/reduction waves broadened as a result of a loss of diffusion control at the electrode interface, a commonly observed phenomenon for redox-active polymers.

TABLE 2

Electrochemical data for 6-oxoverdazyl monomer 12 and polymer 13.

| Compound | $E_{1/2,ox}$ (V vs. Fc/Fc$^+$) | $E_{1/2,red}$ (V vs. Fc/Fc$^+$) |
|---|---|---|
| 12 | 0.24 | −1.36 |
| 13 | 0.25 | −1.35 |

Electrical Properties of Thin Films of Polymer 13

Based on the spectroscopic and electrochemical studies described above, we concluded that polymer 13 may have interesting and potentially unique thin-film properties. To this end, we investigated the electrical properties of thin solid films of this polymer, from approximately 10 nm to 50 nm in thickness, by using a sandwich architecture. Thin polymeric films may have very peculiar morphological and structural properties as a consequence of the preferential alignment of the polymeric chains with respect to the substrate. Specifically, the alignment may be strongly dependent on the thickness, which may sometimes lead to non-ohmic conductivity mechanisms and thickness-dependent resistivity in ultrathin polymeric films.

Figure 7A:
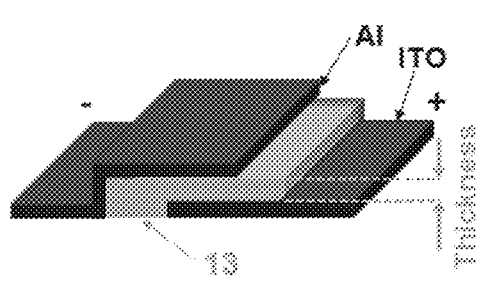
FIG. 7(a) shows a sandwich-type configuration for measuring the I-V characteristics of polymer 13 thin films, showing bistable electrical transport.
Figure 7B:
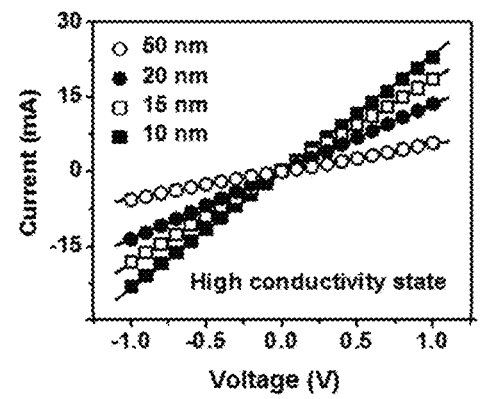
FIG. 7(b) shows current-voltage (I-V) curves of thin films at four different thicknesses in high conductivity state, which were fitted with straight lines to demonstrate ohmic transport.
Figure 7C:
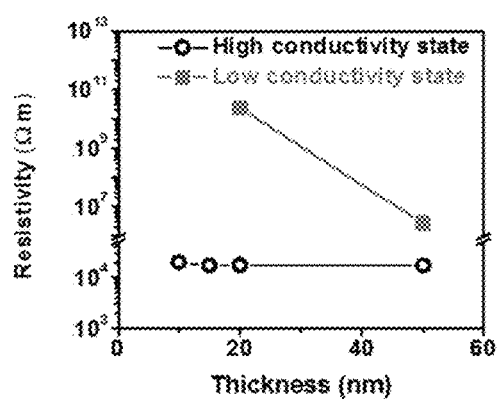
FIG. 7(c) shows I-V curves of thin films in low conductivity state showing non-ohmic, Poole-Frenkel like, behavior. Solid line fits were performed using eq. (2).
Figure 7D:
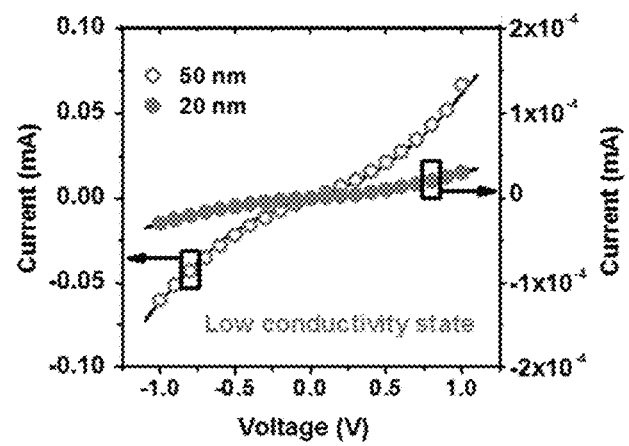
FIG. 7(d) shows film resistivity values obtained from the low-voltage portions of I-V curves. Resistivity is thickness-independent in the high conductivity state, while it dramatically increases at decreasing thickness in the low-conductivity state, possibly due to preferential alignment of polymer filaments along the substrate.

FIG. 7(a) illustrates the configuration we used to measure the I-V characteristics of our films before and after the films were pretreated at high voltage ($V_o$=5 V). In both cases, the film resistivity (ρ) was inferred from the I-V characteristics through the relationship $$\rho = \frac{R \cdot A}{d} \quad (1)$$

where A is the area of the region in which the top and bottom contacts overlap, d is the film thickness and R=V/I is the thin film resistance, obtained from the slope of the I-V characteristics in the proximity of the origin. The I-V curves recorded from our films of polymer 13 are shown in FIGS. 7(b) and 7(c) for measurements recorded after and before 5 V film treatment, respectively. In ohmic systems ρ is an inherent property of the material, independent of the thickness of the thin film that is being considered. After 5 V treatment, all films were electrically ohmic and exhibit a relatively high conductivity, with linear I-V characteristics in the entire ±1 V range as can be observed in FIG. 7(b). The extracted resistivity value (ρ≈1.7×10$^4$ Ω·m, FIG. 7(d)) is thickness independent, as can be expected from ohmic systems. This value favorably compares with poly(2,2,6,6-tetramethylpiperidinyloxy methacrylate) 1 (ρ≈1×10$^4$ Ω·m),[6] the most widely studied stable radical polymer that has also shown defect-dependent thin-film properties.[7] In contrast, FIG. 7(d) also shows that these films are significantly more insulating before the high voltage is treatment at 5 V. They revert to such a low-conductivity state after the effects of high-voltage treatment vanish, typically in 20 TO 200 h.

It is noteworthy that the I-V characteristics before high-voltage treatment of our films are typically non-ohmic, as can be inferred from FIG. 7(c). As a consequence of non-ohmicity, the resistivity inferred from eq. (1) strongly increases as the thickness of the films decreases and could not be measured with our equipment at thicknesses below 20 nm. This suggests that ρ should be higher than 10$^{12}$ Ω·m below this thickness value and, therefore, it may be approximately comparable with that of glass (ρ≈10$^{12}$-10$^{14}$ Ω·m). It can be phenomenologically observed that the I-V curves shown in FIG. 7(c) can be fitted using a Poole-Frenkel model for non-ohmic transport via localized trapped charges, in which the current is related to the voltage by the following relationship:

$$I = \frac{A}{\rho_o d} V \exp\left\{ \frac{-q\Delta\varphi + q^{3/2}\pi^{-1/2}[V/(\varepsilon_m d)]^{1/2}}{k_B T} \right\} \quad (2)$$

where $\rho_o$ corresponds to the polymer resistivity in the absence of traps, q is the electron charge, Δφ is the voltage barrier electrons must cross at low voltage to hop from one charged trap to another, $\varepsilon_m$ is the dielectric permittivity of the polymer relative to vacuum, and $k_B T$=0.025 eV at room temperature.

While the high-conductivity state observed in FIG. 7(b) can be attributed to extended-state transport via free electrons, the low-conductivity, Poole-Frenkel-like transport mechanism observed in FIG. 7(c) can be assigned to hopping between localized states situated at specific charged monomers along a polymer filament. The hopping conditions may be strongly dependent on the degree of alignment of the polymer filaments along the substrate, in analogy to what previously observed in polythiophenes. Specifically, if all of the polymer chains are aligned parallel to the substrate, hopping along the z-direction must occur through localized states situated on different polymer chains, thus explaining why the thinnest films, presumably containing polymer filaments more aligned along the substrate, are also more electrically insulating.

The switchable conductor-insulator transitions in thin films of polymer 13 and their relationship with the redox processes in this material requires further investigations. However, the observation of Poole-Frenkel type transport in the low conductivity state leads us to tentatively suggest that such state corresponds to a situation in which only a few repeating units in a polymer chain are charged, while most of them are in a neutral state. At sufficiently high voltage (i.e., $V \geq V_o \approx 5$ V) charges may directly tunnel from the electrodes into some of the neutral repeating units, charging them either positively or negatively. When a sufficient concentration of charged repeating units is reached in a thin film, a percolating pathway may be established between such repeating units, leading to switching to the high conductivity state, dominated by transport between extended electronic states. This conductor-insulator transition makes polymer 13 uniquely positioned for several applications in bistable electronics.

With respect to the class of compounds S2, SCHEME 2 below outlines a representative synthesis of these S2 polymers, with polymer 14 being a non-limiting example.

SCHEME 2 Synthesis of polymer 14.

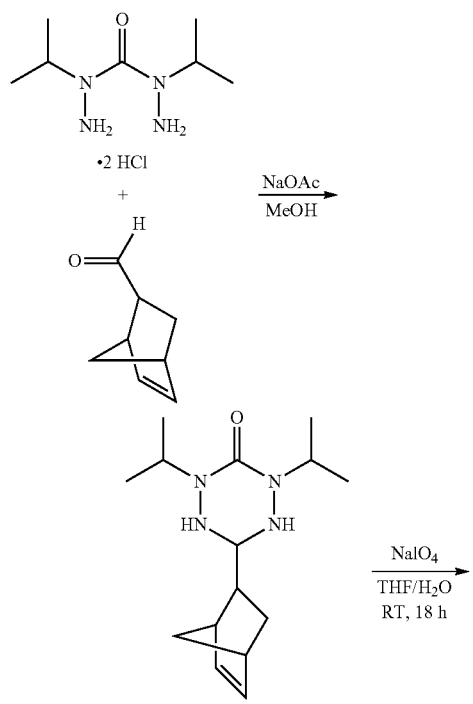

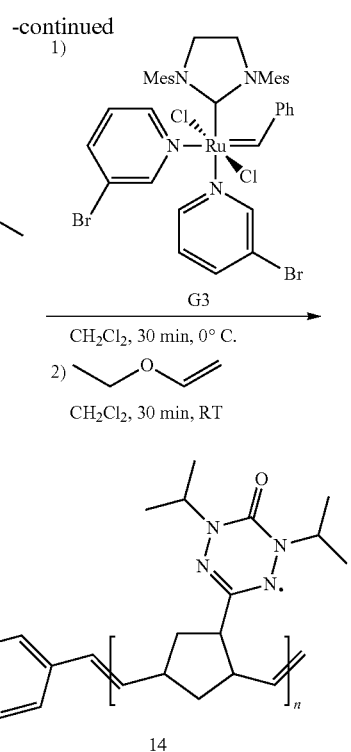

Summary

As a result of this work, we have demonstrated that ROMP using the 3-bromopyridine derivative of Grubbs' 3rd generation catalyst can be used to produce 6-oxoverdazyl polymers with up to ca. 100 repeating units, narrow molecular weight distributions (Đ<1.2), and high radical content (ca. 94%). A representative sample of the 6-oxoverdazyl polymers produced was thermally stable up to a temperature of 190° C. and had a glass transition temperature of 152° C. Comparison of the same polymer, which is stable towards air and moisture, to the monomer employed using several spectroscopic techniques, including IR, UV-vis absorption, and EPR spectroscopy and cyclic voltammetry confirmed the identity and properties of the pendant 6-oxoverdazyl groups were maintained after ROMP. The redox properties of the polymers described led us to explore their thin-film electrical transport properties, revealing a significant decrease in sheet resistance from 240Ω to 26 MΩ upon application of a potential, $V_o$=5 V.

Memristor Device

The phrase "P6OV" refers to polymer 13 and is the 6-oxoverdazyl polymer structures (S1). The 6-oxoverdazyl polymer structures (S1) and (S2) disclosed above may be used to produce memristor devices. These memristors include a support substrate, a first array of electrodes or integrated circuit located on the support substrate, a thin layer of the 6-oxoverdazyl polymer (structures (S1) or (S2)) with the polymer layer having a thickness in a range from about 1 nm to about 1 μm. A second array of electrodes or integrated circuit located is then applied on the top surface of the layer of the 6-oxoverdazyl polymer. One of the electrode arrays or integrated circuit acts as a cathode with the other acts as an anode. The cathode array has a work function in range of about 3 to about 6 eV, and the anode array has a work function in range of about 2 to about 5 eV.

In some embodiments the 6-oxoverdazyl polymer may have C=O as its bridging group B, $R^1$ and $R^5$ may be any one or combination of isopropyl, phenyl, and substituted phenyl, and PG may be the polymerized form of any of the groups cis-5-norbornene-exo-2,3-dicarboximide, norbornene, substituted norbornenes, styrene, acrylate, methacrylate, substituted silacyclobutanes, ethylene glycol, and ethylene oxide. In these embodiments the cathode electrode is selected to have a work function in range of about 3.0 to about 4.8 eV and the anode electrode is selected to have a work function in range of about 2.5 to about 3.5 eV.

The thickness of the layer of 6-oxoverdazyl polymer may have a thickness in a range from about 1 nm to about 25 nm.

Non-limiting examples of memristors produced using 6-oxoverdazyl polymer (polymer 13) structures represented by structure (S1) will now be given.

EXAMPLE

The chemical structure of P6OV (as synthesized above), the polyradical used for the present memristor design and optimization is shown in FIG. 16(a). A distinct advantage of P6OV is that it exhibits three different and tunable charge states: positive, neutral and negative.[33] This polyradical also dissolves readily in a variety of different solvents and can be easily formed into smooth thin films via spin coating, even at the lowest thicknesses. Thin film device fabrication and testing was carried out in a nitrogen-loaded glove box, directly attached to an ultra-high vacuum chamber dedicated to film contacting and metallization.

Sixteen memristors were simultaneously fabricated as shown in FIG. 16(b) by spin coating a 10-nm thick layer of P6OV onto four identical pre-patterned cathode electrodes, with four orthogonal anodes on top. Anodes comprised of aluminum (30 nm) and calcium (20 nm) bilayers, a solution derived from organic solar cell technology, in which it is widely used as it offers tunable work functions of ca. 2.9-3.5 eV, intermediate between Ca and Al. Cathodes investigated in the present study included: i) Indium-tin oxide (ITO) ii) Few layer graphene (FLG) iii) Aluminum, and iv) Ca (20 nm) and Al (30 nm) bilayers (Ca/Al). These cathode materials have significantly different work functions, as shown in FIG. 16(b). They will allow us to achieve different energy-level matched electronic structures, which will be critical for the optimization of the memristor performance.

2.1. Electronic Energy Levels in P6OV

The typical current-voltage (J-V) characteristics of one of our devices is shown in FIG. 16(c). When tested for the first time, devices always exhibit a low-conductivity state. The low-conductivity J-V curve, indicated by open dots in FIG. 16(c), was recorded by sweeping the voltage at ±10 mV s$^{-1}$ rate. Starting from V=0, increasing negative voltages were applied, which led to relatively low current densities, ~10$^{-1}$ A cm$^{-2}$, until "write" voltage conditions were reached at $V_W \leq -4.8$ V. At these voltage levels, the system gradually transitioned to a high-conductivity state, with significantly higher current densities, about 1-10 A cm$^{-2}$. The corresponding J-V curve is indicated by black solid dots in FIG. 16(c) and is representative of significantly higher conductivity in P6OV. The high-conductivity state persists at increasing positive voltages, until "erase" conditions are reached at $V_E \geq +3.5$ V. Sweeping at voltages larger than +3.5 V led the device to gradually revert to the low-conductivity state. This cycle has been repeated up to 50 times on the device shown in FIG. 16(c). As no transitions from high to low-conductivity state and vice versa occur in the $V_R = \pm 1.0$ V range, any voltage $-V_R < V < +V_R$ can be used to "read" the device and understand in which state it lays.

In order to optimize the performance of P6OV as an active memory material, it is imperative to construct an energy-level matched electronic structure for the devices. P6OV in its neutral state is expected to possess a singly-occupied molecular orbital (SOMO) at about mid-gap between the doubly-occupied highest occupied molecular orbital (HOMO, π-bonding), and the lowest unoccupied molecular orbital (LUMO, π*-antibonding). Considering that P6OV is a non-conjugated polymer, the HOMO-LUMO energy band gap $E_{\pi\pi^*}$, corresponding to π →π* interband optical transitions is expected to sit in the near-UV photon energy range, comparable to or slightly lower than 5.6 eV in benzene. From our UV-visible (UV-vis) absorption measurements, seen in FIG. 17(a), a broad and intense optical absorption feature is observed at 4.6 eV, with tails up to 5.0-5.2 eV. We therefore assign this optical absorption peak to π→π* optical transitions between HOMO and LUMO molecular orbitals, with the formation of a delocalized electron-hole pair.

From FIG. 17(a), two less intense optical absorption features are also observed at lower energy, in the blue photon energy range. These peaks can be understood due to the presence of a SOMO energy level within the π-π* optical band gap of P6OV and they can be assigned to SOMO→π* and π→SOMO transitions, respectively. In SOMO→π* transitions, an electron is promoted from an initially neutral (0) SOMO state to the LUMO, with the formation of a localized hole (+) in the correspondence of the SOMO and an electron delocalized in the conduction (e) band. In a π→SOMO transition, one electron is promoted from the HOMO to an initially neutral (0) SOMO state, at which a localized electron (−) is formed in conjunction with a delocalized hole in the valence (π) band. Closeness of the SOMO→LUMO and HOMO→SOMO optical absorption peaks, sitting at $E_{(0),(+,\pi^*)} \approx E_{(0,\pi),(-)} = 3.0 \pm 0.1$ eV, suggests that neutral SOMO energy levels are situated at $\varepsilon_{(0)} = \frac{1}{2}(\varepsilon_\pi + \varepsilon_{\pi^*})$, thus at mid-gap between the π and π* band energy levels, $\varepsilon_\pi$ and $\varepsilon_{\pi^*}$. This leads to the diagram of π, π* and (0) density of electronic states reported in FIG. 17(b). The notation used in this Figure and in the subsequent ones is as follows.

Notation Used to Indicate the Electron Energy Levels in P6OV-based Memristors

A significant advantage of the present P6OV polyradicals is the fact that it exhibits three tunable charge states: positive, neutral and negative. These charge states are respectively represented with the symbols (+), (0), and (−). As is generally the case, the electronic state due to π-bonding and π-antibonding orbitals of the radical P6OV polymer is represented with the symbol π and π* respectively. In order to distinguish between the levels, the symbol ε, with the appropriate subscript, were used to indicate the energy levels of P6OV relative to vacuum as shown in FIG. 22(a). Energy levels $\varepsilon_j$ were determined from a combination of UV-visible (UV-vis) and Kelvin-probe force microscopy (KPFM) measurements as discussed in the experimental section. The Hubbard interaction energy U is calculated from the comparison of SOMO-related optical transitions and π→π* optical transitions using equation 1. The work functions of the electrode materials relative to vacuum are indicated in FIG. 22(a) with the symbol φ with the appropriate subscripts. By comparison of the left and the right side of Figure S1(a) it is possible to identify the conditions at which matching of the energy levels of P6OV and the metal electrodes can be established. FIG. 22(b) shows that optoelectronic transition energy in our P6OV polyradicals. The transition energies, corresponding to differences between electron energy levels, are indicated with the symbol E and the appropriate subscripts and are shown in Table 3.

TABLE 3

| Transition type | Initial | Final | E |
|---|---|---|---|
| HOMO → LUMO $\pi \to \pi^*$ | Initial state: $\pi$ at 6.2 eV | Final state: $\pi^*$ at 1.6 eV | $E_{\pi\pi^*}$ 4.6 eV |
| SOMO → LUMO $(0) \to (+,\pi^*)$ | Initial state: (0) SOMO at 3.9 eV | Final states: (+) hole at 4.7 eV and $\pi^*$ at 1.6 eV | $E_{(0)(+,\pi^*)}$ 3.1 eV |
| HOMO → SOMO $(0,\pi) \to (-)$ | Initial states: $\pi$ at 6.2 eV and (0) SOMO at 3.9 eV | Final state: (−) electron at 3.1 eV | $E_{(0,\pi)(-)}$ 3.1 eV |

Although the energies $E_{(0),(+,\pi^*)}$ and $E_{(0,\pi),(-)}$ we assign to $(0)\to(+, \pi^*)$ (i.e., SOMO→LUMO) and $(0, \pi)\to(-)$ (i.e., HOMO→SOMO) transitions in FIG. 17(b) are similar, it is interesting to observe that their sum, $E_{(0),(+,\pi^*)}+E_{(0,\pi),(-)}\approx 6.2$ eV, is significantly larger than $E_{\pi\pi^*}=4.6$ eV, the $\pi \to \pi^*$ interband transition energy. This phenomenon can be understood by considering the few-electron nature of (+), (0), and (−) electron states. Delocalized $\pi$ and $\pi^*$ electronic bands are multi-electron systems that are marginally affected by the addition or removal of one electron. However, these effects are expectedly more significant when a neutral SOMO state, a single-electron system, undergoes $(0)\to(+, \pi^*)$ or $(0,\pi)\to(-)$ transitions, with the consequent removal or addition of one electron, and the formation of an unoccupied (+) positively charged state or a doubly-occupied (−) negatively charged state.

In few-electron systems, the actual position of an electron energy level is dramatically affected by their occupation number. The subsequent change in energy levels, known as the Hubbard interaction energy U, corresponds to the energy lost or gained by the system due to the addition or removal of one electron as a consequence of the increase or decrease in electron-electron Coulombic repulsion. When positively charged, a neutral (0) SOMO state sitting at $\varepsilon_{(0)}$ below the vacuum level is expected to generate an unoccupied energy level situated at $\varepsilon_{(+)}=\varepsilon_{(0)}+U$. Conversely, when the same SOMO state is negatively charged due to the addition of one extra electron, negative electron-electron Coulombic repulsion energy is more significant and the corresponding doubly occupied energy level will be situated at $\varepsilon_{(-)}=\varepsilon_{(0)}-U$. Consequently, under the assumption that $\varepsilon_{(0)}$ sits at midgap, nonzero Hubbard interaction energy results in $(0)\to(+,\pi^*)$ and $(0,\pi)\to(-)$ optical transitions occurring at $$E_{(0)(+,\pi^*)}=\varepsilon_{\pi^*}-\varepsilon_{(+)}\approx\frac{1}{2}E_{\pi\pi^*}-U; E_{(0,\pi^*)(-)}=\varepsilon_{(-)}-\varepsilon_{\pi}\approx\frac{1}{2}E_{\pi\pi^*}-U \quad (3)$$

respectively, which indicates U≈0.8 eV, consistent with similar values that were previously found in small carbon clusters.

In order to corroborate our UV-vis analysis and confirm the positions of $\varepsilon_\pi$, $\varepsilon_{(-)}$, $\varepsilon_{(0)}$, $\varepsilon_{(+)}$ and $\varepsilon_{\pi^*}$ energy levels, we used Kelvin-probe force microscopy (KPFM) images to directly measure the surface potential of P6OV. Surface potentials determined by KPFM may either correspond to the position of the HOMO level, the SOMO level, or a combination of the two. In the specific case of P6OV, a polyradical exhibiting memory effects, the voltage used for KPFM imaging may influence the occupation number of mid-gap states, which may transition from neutral to positively or negatively charged, depending on the value of the nullifying bias voltage applied to the atomic force microscopy (AFM) tip used for the measurements, and affect the actual value of the surface potential. In order to solve this issue, our KPFM images were performed after a first scan at which a high constant voltage +7 V, higher than the erase voltage of the device, was applied to the tip. Under those conditions, the device is erased, and the value of the surface potential is expected to reflect the position of the HOMO and SOMO levels.

FIG. 17(c) shows the AFM and KPFM images, recorded simultaneously, of a P6OV thin film (bottom half of the images) in close proximity of an aluminum contact thermally evaporated on top of it (top half of the images). The AFM image shows that P6OV is smooth and homogenous, which is indicative of nearly ideal conditions for KPFM measurements. The KPFM image is also entirely uniform, with the exception of the sharp P6OV-Al interface. The Al contact can be used as a reference, since the work function of aluminum is known to be $\varphi_{Al}=4.0$ eV, which compares well with the absolute values of surface potential obtained from nullifying KPFM voltages in that region. The histogram of surface potentials obtained from the Kelvin probe force image in FIG. 17(c) is presented in FIG. 17(d), from which a value of 4.0±0.1 eV, in excellent agreement with the known value of $\varphi_{Al}$, could be determined. Consequently, from the same histogram, it could be inferred that the HOMO energy level of P6OV sits at $\varepsilon_\pi=6.2\pm0.2$ eV below the vacuum level.

From FIG. 17(d), it can also be observed that, in addition to the sharp peak at $\varphi=\varepsilon_\pi=6.2$ eV, the histogram of the surface potential of P6OV possesses a relatively broad tail at lower values of $\varphi$, down to about 4 eV. Although a quantitative multi-peak fit would be too arbitrary, this low-energy tail indicates that values of $\varepsilon_{(0)}=4.0\pm0.2$ eV are consistent with those that were directly inferred from equation (1) and UV-vis absorption data. These results corroborate the band energy diagram of P6OV reported in FIG. 17(b), from which it is worthwhile noting that the energy level of unoccupied and positively charged polyradical sites, $\varepsilon_{(+)}=4.7\pm0.2$ eV, aligns well with the work function of ITO electrodes, $\varphi_{ITO}=4.7$ eV. Conversely, the energy level of doubly-occupied and negatively charged polyradical sites, $\varepsilon_{(-)}=3.1\pm0.2$ eV, aligns well with the work function of Ca/Al electrodes, $\varphi_{Ca/Al}=3.1$ eV. Finally $\varepsilon_{(0)}$, the energy level of the neutral SOMO state, matches the work function of pure Al (($\varphi_{Al}=4.0$ eV). We anticipate that these findings will be essential for the construction and optimization of P6OV memristors, as well as for studying their transport properties, both in the high-conductivity and low-conductivity regimes.

Memristor Design Criteria

FIGS. 18(a) and 18(b) compare the current-voltage characteristics in the high-conductivity and low-conductivity regimes of four different devices. Such devices have the same anode, an Al/Ca bilayer, but utilize four different cathode materials at work functions ranging from $\varphi=3.1$ eV (for Ca/Al) to $\varphi=4.7$ eV (for ITO). Pure aluminum and weakly-oxidized few-layer graphene ($\varphi_{FLG}=4.5$ eV) have work functions with intermediate values between those of Ca/Al and ITO. All of these work functions were measured by KPFM, and are in excellent agreement with the values that can be found in the literature. FIG. 18(a) shows the J-V curves of the devices in the high-conductivity regime, which are representative of to typical values that were consistently found in a large number of similar devices. Conductivity in the high-conductivity regime was found to decrease in the order of $$\sigma_H(ITO) > \sigma_H(FLG) > \sigma_H(Al) > \sigma_H(Ca/Al) \quad (4)$$

and, therefore, is higher for ITO-based devices, of which the cathode work function aligns with the surface potential of positively charged P6OV, $\varphi_{ITO} = \varepsilon_{(+)} = 4.7$ eV. In the other three types of devices, with FLG, Al and Ca/Al cathodes and $\varphi \neq \varepsilon_{(+)}$, $\sigma_H$ decreases at decreasing work function of cathode, proportionally to $\exp(-|\varepsilon_{(+)} - \varphi|/k_B T)$. $\sigma_H$ is lowest in devices with symmetric anode and cathode, both made out of Ca-coated aluminum. Even though their electrode work function matches the surface potential of negatively charged P6OV at $\varphi_{Ca/Al} = \varepsilon_{(-)} = 3.1$ eV, the (+) energy level is much higher, at 4.7 eV, which leads to very significant contact resistance. The nearly ohmic characteristics of the J-V curves, demonstrated in FIG. 18(c) for a device with FLG cathode, indicates extended-state transport in the high-conductivity regime for all of the devices irrespective of the cathode material, consistently with previous observations in P6OV. These observations strongly suggest that 6H is determined by the contact resistance between positively charged P6OV monomers and the cathode in the same way as the contact resistance between negatively charged P6OV monomers and the anode. Consequently, it is demonstrated that both positively charged (+) and negatively charged (−) 6-oxoverdazyl rings in P6OV are required to observe extended state transport and high-conductivity regime in thin film memristors of this polyradical.

Further insight into the bistability and transport properties of P6OV memristors can be gained by observing their behavior in low-conductivity regime. In such regime, their conductivity can be inferred from the J-V curves in FIG. 18(b), and was observed to decrease in the order of $$\sigma_L(Al) > \sigma_L(FLG) > \sigma_L(ITO) > \sigma_L(Ca/Al). \quad (5)$$

Consequently, $\sigma_L$ is higher for cathodes of pure aluminum, with work function $\varphi_{Al} = \varepsilon_{(0)} = 4.0$ eV, aligning to the SOMO of neutral P6OV. In the other three types of devices, with FLG, ITO and Ca/Al cathodes at $\varphi \neq \varepsilon_{(0)}$, c decreases as $\exp(-|\varepsilon_{(0)} - \varphi|/k_B T)$. This indicates that the conductivity of P6OV memristors in the low-conductivity regime is determined by the contact resistance between the SOMO and the cathode. Such an observation agrees with previous findings that the transport properties in such regime obey a Poole-Frenkel transport mechanism, demonstrated in FIG. 18(d), which involves diffusion of a limited number of localized electrons that are hopping through an array of neutral P6OV repeating units.

FIGS. 19(a) and 19(b) summarize the information on the charge transport mechanism of the present memristors in the low-conductivity (FIG. 19(a)) and high-conductivity (FIG. 19(b)) regimes, as can be inferred from the results shown in FIGS. 18(a) to 18(c). In the low-conductivity regime, P6OV monomers are in the neutral charge state. This finding is corroborated by previous electron spin resonance (ESR) measurements showing a number of paramagnetic radicals comparable to the number of monomers. Optimal charge injection in the low-conductivity state occurs by electrons transferred from the Al cathode at 4.0 eV work function. Such electrons hop between polymer repeating units in a Poole-Frenkel transport mechanism, for which a limited number of monomers become positively charged. Hopping processes are relatively inefficient transport mechanisms, due to the localized nature of the carriers. This explains the low conductivity in this regime.

Application of sufficiently high electric fields leads to charge polarization of thin film dielectric materials. This is consistent with the fact that the 3.5 V threshold for erase voltages in our devices correspond to an energy e $V_E \approx 4$ U, which is the sum of the formation energies of a doubly-occupied, negatively charged monomer and an unoccupied and positively charged monomer. This configuration, shown in FIG. 4b, preserves the charge neutrality of the polymer chain and is consistent with the observed lack of ESR signal in P6OV thin films in the high-conductivity state. In this regime, which occurs after the P6OV is polarized by an external electric field, ambipolar transport may occur by extended states, via diffusion of electrons towards the anode and simultaneous migration of holes through the cathode.

It is worthwhile noting that, in this regime, optimal hole injection occurs for charges transferred from ITO to the $\varepsilon_{(+)}$ level of P6OV, both at ~4.7 eV, while optimal electron injection of electrons occurs for charges transferred from Ca/Al to the $\varepsilon_{(-)}$ level of P6OV, both at ~3.1 eV. For practical memristor applications, the "on" current in the high-conductivity state needs to be maximized, while the "off" current in the low-conductivity state needs to be kept to a minimum. Therefore, Al/Ca-P6OV-ITO architectures are optimal for the fabrication of polyradical thin film memristors based on P6OV, and our design criteria can be extended to ultrathin memory devices from a large variety of polyradicals, clearly indicating the generality of our study.

It is also important to bear in mind that the transport mechanism proposed in FIGS. 19(a) and 19(b) for the present polyradical system in the high-conductivity state requires the polarization of an entire polyradical chain, not only individual monomers. Thus, the present model is mesoscopic in nature and not limited to individual quantum systems. The fact that, in the present case, the Hubbard interaction energy of a single radical monomer coincides with the corresponding quantity averaged over an entire polyradical is a consequence of the fact that P6OV is non-conjugated and, therefore, each monoradical can be treated as a nearly isolated system. However, this does not limit the generality of the model, which can be applied to conjugated systems by considering that U can still be defined in such cases, and decreases with the number of monomers in the polyradical.

Memristor Performance

To demonstrate the important significance of the electrode work functions in relation to the energy levels of the polyradical and the performance of the memory fabricated devices, the present inventors carried out multiple consecutive cycles of electrical switching between low and high-conductivity regimes, as illustrated in FIGS. 20(a) to 20(d). Switching cycles presented in this work were performed for devices with the same anode, an Al/Ca bilayer, but different cathode materials with work functions decreasing from $\varphi = 4.7$ eV (for ITO, FIG. 20(a) to $\varphi = 3.1$ eV (for Ca-coated Al, FIG. 20(d). In all of these devices, the write, read and erase conditions were implemented by applying an appropriate external voltage, as previously shown in FIG. 16(c). The switching of applied voltages is demonstrated by the lower curves in FIGS. 20(a) to 20(d).

FIGS. 20(a) to 20(c) confirms that negative 4.8 V write voltages brought the devices shown in FIGS. 20(a) to 20(c) to a high-conductivity state. This regime led to relatively high output currents that could be read at +1.0 V applied voltage, while no appreciable transition could be observed in the symmetric Al/Ca-P6OV-Ca/Al device shown in FIG. 20(d). In FIGS. 20(a) to 20(c), a positive 3.5 V erase voltage eliminated the previously established high-conductivity regime, and returned the device to the low-conductivity state, as could be confirmed by subsequent readings at +1.0 V.

Effect of Switching Speed on the Performance of P6OV-based Memristors

In order to explore the role of switching speed on the current-voltage (I-V) characteristics of P6OV-based thin film memristors, devices with Al/Ca-P6OV-ITO architecture were tested by recording I-V scans at different scan speeds, from 2.5 V/ms to 2.5 10³ mV/ms, as shown in FIG. 23. From this FIG. 23, it is apparent that the write ($V_W$) and erase ($V_E$) voltages, signalling the transition from the low-conductivity state to the high-conductivity state and vice versa, are constant at $V_W$=−4.8 V and $V_E$=3.5 V, respectively, and independent of the scan speed for the entire speed range. Furthermore, also indicating little dependence of the on/off switching speeds on the scan speed at which the device is driven. This indicates that the Al/Ca-P6OV-ITO devices can be operated at speeds down to the order of a few milliseconds.

As these results demonstrate, no significant changes in the write and erase voltages were observed, even at sweep rates as fast as 2.5 V/ms. This indicates that the present devices can be operated at least up to frequencies in the kHz regime. Once the devices switched to either state, they produced output currents commensurate with the conductivity in such regime, accordingly to equations (2) and (3). Dramatically different behaviors and on/off ratios are therefore expected with different cathode materials.

Current changes during multiple sequences of write-read-erase-read cycles are demonstrated by the top curves in FIGS. 20(a) to 20(d), with the currents measured during six read cycles at $V_R$=1.0 V are indicated by black dotted lines. In FIGS. 20(a) and 20(b), the two dotted lines are parallel and well distinguishable, indicating that different currents are reproducibly measured in the high-conductivity and low-conductivity regimes even after several write and erase operations. FIGS. 20(a) and 20(b) demonstrate that a bit can be written, stored, read and erased multiple times in P6OV based memristors with ITO and FLG cathodes. High on/off current ratios are generally associated with superior memory device performance. The present memristors fabricated on ITO and FLG cathode materials (work functions: $\varphi_{ITO}$=4.7 eV and $\varphi_{FLG}$=4.5 eV, respectively) exhibited on/off current ratios of 400 and 30, respectively.

These results point to the strong significance of the work function of the cathode materials on the performance of these memristors and with the fact that ITO cathodes are optimal for the performance of our devices, consistently with the band diagrams drawn in FIGS. 19(a) and 19(b). Stability and reproducibility of both ITO-based and FLG-based devices indicate that they both exhibit flash memory effects.

FIG. 20(c) shows that the "on" current of P6OV memristors with cathodes of pure Al decreases linearly with time after multiple write and erase cycles. Specifically, the on/off current ratio was about 6 during the first cycle, but decreased to 4 after the third writing cycle in this device architecture. Consequently, devices with Al cathode do not possess the same degree of stability and reproducibility of flash devices built on ITO and FLG electrodes, and they exhibit WORM effects. We assign this phenomenon to the lower work function of Al which aligns with the neutral energy level of P6OV, $\varepsilon_{(0)}$=4.0 eV. In this configuration, electron transport from Al/Ca to the negatively charged energy level of P6OV and Al, at 4.0 eV is still optimized, but hole transport is not. Specifically, the positive energy level of P6OV, at $\varepsilon_{(+)}$=4.7 eV, acts as a high-energy trap for holes diffusing from 4.0 eV energy in Al to 3.1 eV energy in Ca. This leads to the gradual depolarization and neutralization of some of the charged radical monomers of P6OV, corresponding to the gradual collapse of the high-conductivity state shown in FIG. 19(b). The inventors contemplate that this effect is general enough to lead to lack of flash effects in several non-optimized polyradical memory devices that have been recently proposed in the literature.[33-35]

In view of the above mentioned considerations, the major obstacle to polyradical memristor performance is in carefully engineering the contact resistance between the polymer thin films and the electrodes. FIG. 21(a) demonstrates that a relationship exists between the cathode-anode work function difference and the measured on/off current ratios of the devices. Specifically, in symmetric Al/Ca-P6OV-Ca/Al devices, in which no surface potential difference between the electrodes exists, the high-conductivity state is extremely volatile and can only be retained for a relatively short time. Although J-V curves in the high-conducting regime can be obtained with relatively rapid scans as in FIG. 18(b), no on/off current ratio higher than 1 could be obtained during write-read-erase-read cycles, and non-volatile devices could not be achieved.

The capability of optimized memristors to retain information for a long period of time was further investigated. Once the on state of a device was activated, it was left in the glove box under nitrogen atmosphere without applied bias voltage. After a prolonged period of time, lasting up to several days, the device was still observed to remain in the same state and switched states only with appropriate voltage bias. FIG. 21(b) shows the result of the stability test studied on the same device under repeated cycles of bias conditions. FIG. 21(b) reveals that this device maintains excellent switching characteristics without degradation for several tens cycles of on-off switching. These excellent switching cycles is a further demonstration that this type of devices, fabricated using a homogeneous layer of P6OV polyradical, exhibit promising characteristics for operation as nonvolatile flash memristors.

CONCLUSION

The present disclosure provides a design criterion for ultrathin memristors based on a homogeneous active layer of polyradical material, with P6OV (structure (A)) as a case study. Devices presented in this work utilized a sandwich configuration with aluminum-calcium bilayers as anode material, and four cathode materials at different work functions, ranging from $\varphi$=4.7 eV for ITO electrodes to $\varphi$=3.1 eV for calcium-aluminum bilayers. The energy levels of the positively, neutral and negatively charge states of P6OV have been determined from a combination of UV-Vis and KPFM measurements. The behavior of the SOMO energy level of P6OV at different degrees of charging could be understood in the framework of the Hubbard model by assuming a correlation energy U=0.8 eV. Knowledge of the positive, neutral and negative energy levels were vital to configure our memristor architectures for maximum performance.

Although switching effects have been demonstrated here in a sandwich configuration, conducting AFM will be essential as a future tool for probing memory switching effects in P6OV at the nanoscale. Conducting AFM measurements are particularly challenging in this system because of the thinness of the soft polyradical samples, which are easily damaged by the AFM tip when working in contact-mode as required by conducting scanning probe measurements. Furthermore, native oxide at the AFM tip surface may affect spin polarization. This may be a significant issue in radical polymers in which transport is highly spin polarized, as shown in FIG. 19. Nanoscale transport and conducting AFM measurements in polyradical memory devices will be the subject of future work.

Current-voltage characteristics show that a high-conductivity regime can be created, and subsequently eliminated by applying an erase voltage to the devices of the order of $V_E \approx 4$ U/e. Resistivity in the high-conductivity regime was found to be lower for ITO-based devices, in which the work function of the cathode matches the surface potential of positively charged P6OV radicals: $\varphi_{ITO} = \varepsilon_{(+)} = 4.7$ eV. In the other three types of devices, with FLG, Al and Ca/Al cathodes and $\varphi < \varepsilon_{(+)}$, the "on" current decreased at decreasing work function of the cathode. In the low-conductivity regime, the resistivity of P6OV memristors was determined by the contact resistance between the SOMO energy of neutral P6OV and the cathode. Consequently, the electrical conductivity was higher for devices with cathodes of pure aluminum, with work function $\varphi_{Al} = \varepsilon_{(0)} = 4.0$ eV, but decreases in the other types of devices with FLG, ITO and Ca/Al cathodes, as the mismatch between the SOMO level $\varepsilon_{(0)}$ and the cathode work function increases. We demonstrated that the electrical bistability of our devices is due to two distinct transport regimes in P6OV, extended states and Poole-Frenkel.

Optimized flash memory effects were demonstrated in Al/Ca-P6OV-ITO, in which the energy levels of the positively and negatively charged states of the polyradical align, respectively, to the cathode and anode work functions. More than $10^3$ seconds of write-read-erase-read cycles were performed without significant current degradation. Conversely, Al/Ca-P6OV-Al devices, in which the cathode work function aligned with the neutral energy level of P6OV, exhibited WORM effects. The present results demonstrate the importance of energy-level matched electronic structures as the basis on which ultrathin, single-layer memristors can be successfully implemented.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

REFERENCES

1 R. G. Hicks, Stable radicals: fundamentals and applied aspects of odd-electron compounds; Wiley: Chichester, UK, 2010.
2 K. Oyaizu, H. Nishide, *Adv. Mater.* 2009, 21, 2339.
3 T. Janoschka, M. D. Hager, U. S. Schubert, *Adv. Mater.* 2012, 24, 6397.
4 E. P. Tomlinson, M. E. Hay, B. W. Boudouris, *Macromolecules* 2014, 47, 6145.
5 T. K. Kunz, M. O. Wolf, *Polym. Chem.* 2011, 2, 640.
6 L. Rostro, A. G. Baradwaj, B. W. Boudouris, *ACS Appl. Mater. Interfaces* 2013, 5, 9896.
7 L. Rostro, S. H. Wong, B. W. Boudouris, *Macromolecules* 2014, 47, 3713.
8 Y. Yonekuta, K. Susuki, K. Oyaizu, K. Honda, H. Nishide, *J. Am. Chem. Soc.* 2007, 129, 14128.
9 Y. Yonekuta, K. Honda, H. Nishide, *Polym. Adv. Technol.* 2008, 19, 281.
10 T. Suga, K. Aoki, H. Nishide, *ACS Macro Lett.* 2015, 4, 892.
11 M. Suguro, S. Iwasa, K. Nakahara, *Macromol. Rapid Commun.* 2008, 29, 1635.
12 J. Qu, T. Katsumata, M. Satoh, J. Wada, T. Masuda, *Polymer* 2009, 50, 391.
13 Y.-H. Wang, M.-K. Hung, C.-H. Lin, H.-C. Lin, J.-T. Lee, *Chem. Commun.* 2011, 47, 1249.
14 T. K. Kunz, M. O. Wolf, *Polym. Chem.* 2011, 2, 640.
15 M.-K. Hung, Y.-H. Wang, C.-H. Lin, H.-C. Lin, J.-T. Lee, *J. Mater. Chem.* 2012, 22, 1570.
16 T. Janoschka, A. Teichler, A. Krieg, M. D. Hager, U. S. Schubert, *J. Polym. Sci., Part A: Polym. Chem.* 2012, 50, 1394.
17 T. Suga, M. Sakata, K. Aoki, H. Nishide, *ACS Macro Lett.* 2014, 3, 703.
18 B. Ernould, M. Devos, J.-P. Bourgeois, J. Rolland, A. Vlad, J.-F. Gohy, *J. Mater. Chem. A* 2015, 3, 8832.
19 T. W. Kemper, R. E. Larsen, T. Gennett, *J. Phys. Chem. C* 2015, 119, 21369.
20 T. Suga, S. Sugita, H. Ohshiro, K. Oyaizu, H. Nishide, *Adv. Mater.* 2011, 23, 751.
21 J. Qu, T. Fujii, T. Katsumata, Y. Suzuki, M. Shiotsuki, F. Sanda, M. Satoh, J. Wada, T. Masuda, *J. Polym. Sci., Part A: Polym. Chem.* 2007, 45, 5431.
22 P. Nesvadba, L. Bugnon, P. Maire, P. Novák, *Chem. Mater.* 2010, 22, 783.
23 T. Suga, Y.-J. Pu, S. Kasatori, H. Nishide, *Macromolecules* 2007, 40, 3167.
24 T. Suga, H. Ohshiro, S. Sugita, K. Oyaizu, H. Nishide, *Adv. Mater.* 2009, 21, 1627.
25 J. T. Price, J. A. Paquette, C. S. Harrison, R. Bauld, G. Fanchini, J. B. Gilroy, *Polym. Chem.* 2014, 5, 5223.
26 F. Zhang, C. Di, N. Berdunov, Y. Hu, Y. Hu, X. Gao, Q. Meng, H. Sirringhaus, D. Zhu, *Adv. Mater.* 2013, 25, 1401.
27 E. C. Pare, D. J. R. Brook, A. Brieger, M. Badik, M. Schinke, *Org. Biomol. Chem.* 2005, 3, 4258.
28 L. Ren, J. Zhang, X. Bai, C. G. Hardy, K. D. Shimizu, C. Tang, *Chem. Sci.* 2012, 3, 580.
29 Bruker-AXS, SAINT version 2013.8, 2013, Bruker-AXS, Madison, Wis. 53711, USA.
30 Bruker-AXS, SADABS version 2012.1, 2012, Bruker-AXS, Madison, Wis. 53711, USA.
31 G. M. Sheldrick, *Acta Crystallogr., Sect. C: Struct. Chem.* 2015, 71, 3.
32 G. M. Sheldrick, *Acta Crystallogr., Sect. A: Found. Adv.* 2015, 71, 3.
33 J. A. Paquette, S. Ezugwu, V. Yadav, G. Fanchini, J. B. Gilroy, *J. Polym. Sci., Part A: Polym. Chem.* 2016, 54, 1803.
34 G. Liu, B. Zhang, Y. Chen, C. X. Zhu, L. Zeng, D. S. H. Chan, K. G. Neoh, J. Chen, E. T. Kang, *J. Mater. Chem.* 2011, 21, 6027.
35 H. J. Yen, H. H. Tsai, C. Y. Kuo, W. Y. Nie, A. D. Mohite, G. Gupta, J. Wang, J. H. Wu, G. S. Liou, H. L. Wang, *J. Mater. Chem. C* 2014, 2, 4374.

Therefore what is claimed is:

1. A memristor, comprising:
   a support substrate, a first array of electrodes or integrated circuit located on the support substrate;
   a layer of a verdazyl polymer located on said first electrode array, said layer having a thickness in a range from about 1 nm to about 1 µm, and said verdazyl polymer having a structure (S1):

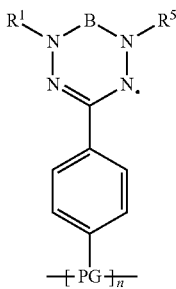

(S1)

in which
B is a bridging group which is any one of C=O, C=S, CH$_2$, and CHAr where Ar is a phenyl or substituted phenyl;
R$^1$ and R$^5$ are N-substituents which include any one of methyl, isopropyl, tertbutyl, phenyl, substituted phenyls, thiophene, furan, pyrrole, imidazole, pyridine, dimethylaminopyridine, pyrimidine, and indole;
PG is the polymerized form of a group, the group including any one of cis-5-norbornene-exo-2,3-dicarboximide, norbornene, substituted norbornenes, styrene, vinyl, alkynyl, acrylate, methacrylate, substituted silacyclobutanes, ethylene glycol, and ethylene oxide; and
n is an integer equal to or greater than 1;
a second array of electrodes or integrated circuit located on a top surface of the layer of a verdazyl polymer; and
one of said first and second array of electrodes or integrated circuits being a cathode, said cathode having a work function in range of about 3 to about 6 eV, and the other array of electrodes being an anode, said anode having a work function in range of about 2 to about 5 eV.

2. The memristor according to claim 1 wherein said cathode electrode has a work function in range of about 3.0 to about 4.8 eV.

3. The memristor according to claim 2 wherein said anode electrode has a work function in a range of about 2.5 to about 3.5 eV.

4. The memristor according to claim 1, wherein said layer of verdazyl polymer has a thickness in a range from about 1 nm to about 25 nm.

5. The memristor according claim 1, wherein R$^1$ and R$^5$ are isopropyl, and wherein B is C=O, and wherein PG is cis-5-norbornene-exo-2,3-dicarboximide, and wherein n is between 1 and about 100.

6. A memristor, comprising:
a support substrate, a first array of electrodes or integrated circuit located on the support substrate;
a layer of a verdazyl polymer located on said first electrode array, said layer having a thickness in a range from about 1 nm to about 1 µm, and said verdazyl polymer having a structure (S2):

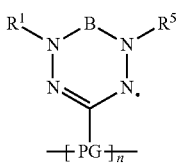

(S2)

in which
B is a bridging group which is any one of C=O, C=S, CH$_2$ and CHAr where Ar is a phenyl or substituted phenyl;
R$^1$ and R$^5$ are N-substituents which include any one of methyl, isopropyl, tertbutyl, phenyl, substituted phenyls, thiophene, furan, pyrrole, imidazole, pyridine, dimethylaminopyridine, pyrimidine, and indole;
PG is the polymerized form of a group, the group including any one of cis-5-norbornene-exo-2,3-dicarboximide, norbornene, substituted norbornenes, styrene, vinyl, alkynyl, acrylate, methacrylate, substituted silacyclobutanes, ethylene glycol, and ethylene oxide; and
n is an integer equal to or greater than 1;
a second array of electrodes or integrated circuit located on a top surface of the layer of a verdazyl polymer; and
one of said first and second array of electrodes or integrated circuits being a cathode, said cathode having a work function in range of about 3 to about 6 eV, and the other array of electrodes being an anode, said anode having a work function in range of about 2 to about 5 eV.

7. The memristor according to claim 6 wherein said cathode electrode has a work function in range of about 3.0 to about 4.8 eV.

8. The memristor according to claim 7 wherein said anode electrode has a work function in range of about 2.5 to about 3.5 eV.

9. The memristor according to claim 6, wherein said layer of verdazyl polymer has a thickness in a range from about 1 nm to about 25 nm.

10. The memristor according to claim 1, wherein said bridging group B is C=O, said R$^1$ and R$^5$ are isopropyl, phenyl, or substituted phenyl and wherein PG is the polymerized form of group cis-5-norbornene-exo-2,3-dicarboximide, norbornene, substituted norbornenes, styrene, acrylate, methacrylate, substituted silacyclobutanes, ethylene glycol, or ethylene oxide.

11. The memristor according to claim 1, wherein R$^1$ and R$^5$ are identical.

12. The memristor according to claim 1, wherein R$^1$ and R$^5$ are different.

13. The memristor according to claim 1, wherein n is in a range from 1 to about 25,000.

14. The memristor according to claim 1, wherein the substituted phenyls include phenyl rings bearing one or more methyl, methoxy, alcohol, amine, nitro, cyano, dimethylamino, fluoro, chloro, bromo, iodo, sulfoxy, carboxy, alkynyl, and alkenyl substituents.

15. The memristor according to claim 6, wherein said bridging group B is C=O, said R$^1$ and R$^5$ are isopropyl, phenyl, or substituted phenyl and wherein PG is the polymerized form of group cis-5-norbornene-exo-2,3-dicarboximide, norbornene, substituted norbornenes, styrene, acrylate, methacrylate, substituted silacyclobutanes, ethylene glycol, or ethylene oxide.

16. The memristor according to claim 6, wherein R$^1$ and R$^5$ are identical.

17. The memristor according to claim 6, wherein R$^1$ and R$^5$ are different.

18. The memristor according to claim 1, wherein n is in a range from 1 to about 25,000.

19. The memristor according to claim 6, wherein the substituted phenyls include phenyl rings bearing one or more methyl, methoxy, alcohol, amine, nitro, cyano, dimethylamino, fluoro, chloro, bromo, iodo, sulfoxy, carboxy, alkynyl, and alkenyl substituents.

20. The memristor according to claim 6, wherein n is in a range from 1 to about 25,000.

* * * * *